(12) United States Patent
Zieren et al.

(10) Patent No.: US 9,702,958 B2
(45) Date of Patent: Jul. 11, 2017

(54) MAGNETIC SENSORS

(75) Inventors: Victor Zieren, Valkenswaard (NL);
Robert Hendrikus Margaretha Van Veldhoven, Dommelen (NL); Olaf Wunnicke, Eindhoven (DE); Hans Paul Tuinhout, Heeze (NL)

(73) Assignee: NXP B.V., Eindhoven (NL)

( * ) Notice: Subject to any disclaimer, the term of this patent is extended or adjusted under 35 U.S.C. 154(b) by 688 days.

(21) Appl. No.: 14/000,591

(22) PCT Filed: Feb. 29, 2012

(86) PCT No.: PCT/EP2012/053419
§ 371 (c)(1),
(2), (4) Date: Aug. 20, 2013

(87) PCT Pub. No.: WO2012/119900
PCT Pub. Date: Sep. 13, 2012

(65) Prior Publication Data
US 2013/0338956 A1 Dec. 19, 2013

(30) Foreign Application Priority Data
Mar. 4, 2011 (EP) .................................. 11250250

(51) Int. Cl.
*G01R 35/00* (2006.01)
*G01R 33/00* (2006.01)
(Continued)

(52) U.S. Cl.
CPC ....... *G01R 35/005* (2013.01); *G01R 33/0035* (2013.01); *G01R 33/06* (2013.01); *G01R 33/066* (2013.01); *H01L 29/82* (2013.01)

(58) Field of Classification Search
CPC .. G01R 33/06; G01R 33/0035; G01R 35/005; G01R 33/066; H01L 29/82
(Continued)

(56) References Cited

U.S. PATENT DOCUMENTS 4,100,563 A * 7/1978 Clark ...................... H01L 29/82
257/423
4,694,248 A 9/1987 Kordi et al.
(Continued)

FOREIGN PATENT DOCUMENTS

EP 2 495 578 A1 9/2012
WO 2009/050673 A1 4/2009

OTHER PUBLICATIONS

Metz, M. et al. "Offset in CMOS Magnetotransistors—Part II: Reduction", IEEE Transactions on Electron Devices, vol. 48, No. 9, pp. 1954-1960 (Sep. 1, 2001).
(Continued)

*Primary Examiner* — Alexander Satanovsky
*Assistant Examiner* — Lina Cordero
(74) *Attorney, Agent, or Firm* — Rajeev Madnawat

(57) ABSTRACT

A governing circuit for a magneto-transistor is disclosed. The magneto-transistor comprising a first and second collector. At least one emitter and at least one base. The governing circuit is configured to measure a first calibration current at the first collector of the magneto-transistor and a second calibration current at the second collector of the magneto-transistor, while a calibration base-emitter voltage is applied to the magneto-transistor. The magneto-transistor is also configured to measure a first measurement current at the first collector of the magneto-transistor and a second measurement current at the second collector of the magneto-transistor, while a measurement base-emitter voltage is applied to the magneto-transistor, wherein the measurement base-emitter voltage is different form the calibration base-emitter voltage and determine an output signal indicative of an applied magnetic field using the measured first and second measurement current and first and second calibration currents.

28 Claims, 15 Drawing Sheets

(51) Int. Cl.
*G01R 33/06* (2006.01)
*H01L 29/82* (2006.01)

(58) Field of Classification Search
USPC .......................................................... 702/104
See application file for complete search history.

(56) References Cited

U.S. PATENT DOCUMENTS

| | | | | |
|---|---|---|---|---|
| 4,734,594 | A * | 3/1988 | Nelson | H03K 17/90 323/368 |
| 5,323,050 | A | 6/1994 | Ristic | |
| 5,438,257 | A * | 8/1995 | Berkcan | G01R 15/146 324/117 H |
| 5,446,307 | A | 8/1995 | Lux et al. | |
| 5,717,536 | A * | 2/1998 | Jung | G11B 5/012 360/46 |
| 2001/0050552 | A1* | 12/2001 | Sandquist | G01R 15/205 324/117 R |
| 2003/0183890 | A1* | 10/2003 | Hauenstein | G01R 33/06 257/427 |
| 2009/0273340 | A1* | 11/2009 | Stephanson | G01R 33/10 324/202 |
| 2009/0296780 | A1* | 12/2009 | Lee | G01K 7/01 374/178 |

OTHER PUBLICATIONS

Riccobene, C. et al. "First Three-Dimensional Numerical Analysis of Magnetic Vector Probe", Tech. Digest of IEDM, pp. 727-730 (Dec. 11, 1994).

International Search Report and Written Opinion for Int'l. Patent Application No. PCT/EP2012/053419 (May 23, 2012).

Metz et al. "Low-offset CMOS magneto-transistor with emitter-collector switching", Proc. Transducers '99, Sendai, Japan, Jun. 7-10, 1999, pp. 88-91.

* cited by examiner

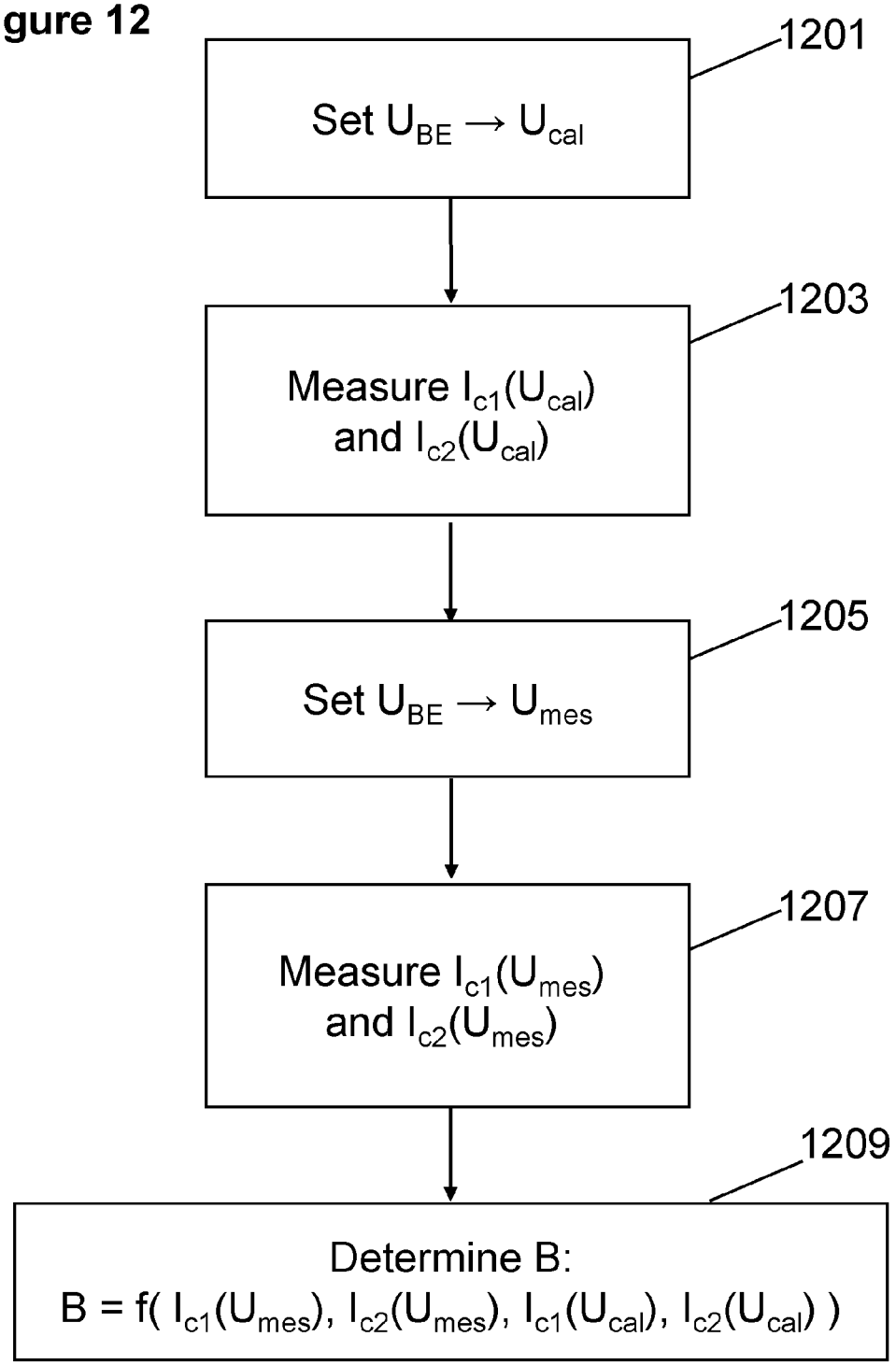

MAGNETIC SENSORS

The present disclosure relates to the field of magnetic sensors and associated methods. Certain disclosed aspects/embodiments relate to semiconductor (e.g. silicon-based) magnetic sensors.

Sensors are increasingly important in various industries. For example, in the automotive industry various sensors such as parking sensors, angular sensors, ABS (Anti-lock Braking System) sensors and tyre pressure sensors can be found in modern vehicles for improving comfort and safety. Magnetic sensors may be particularly important in automotive applications, because magnetic fields may penetrate through non-magnetic materials. Magnetic sensors may also be very insensitive to dirt, unlike, for example, optical sensors.

Several different magnetic sensor technologies are currently available, such as sensors based on the Hall effect or the magneto-resistive effect. Anisotropic magneto-resistive (AMR) and giant magneto-resistive (GMR) sensors are particular examples of sensor types based on various magneto-resistive effects. Hall effect sensors can be integrated monolithically into integrated circuits, which may make them cheap, but they tend to exhibit low sensitivity and consequently inaccuracy, for example due to offset and noise. AMR sensors tend to have a much higher sensitivity compared to Hall effect sensors, although can require more fabrication steps in order to be integrated monolithically, which can make a total sensor system more expensive. AMR sensors may be deposited, for example, by sputtering of $Ni_{80}Fe_{20}$ on a separate die or on top of a monolithic structure. An annealing process, sometimes in a magnetic field, is used for stabilisation of the magneto-resistive material.

GMR sensors typically have a higher sensitivity than AMR sensors. However, a GMR sensor consists of various thin layers and critical interfaces. Therefore, the technology required to fabricate such sensors may be considerably more complicated and expensive. Furthermore, due to the thin multiple layers making up a GMR sensor, the operating temperature range may be limited. Therefore, often AMR sensors are chosen as a compromise in magnetic sensor applications.

As silicon Hall sensors can be cheap because they can be monolithically integrated, they have become widely used. Several different types of Hall sensors are known, such as the Hall plate, the MAGFET, the magneto-transistor, etc. A Hall plate comprises an n-doped or p-doped area of semiconductor with four contacts. Two contacts are used to drive current through the semiconductor. Under the influence of the Lorentz force, the charge carriers initially will deflect under a magnetic field applied transverse to the semiconductor surface. Therefore, a current or voltage difference can be measured between the two other contacts. A disadvantage of this type of sensor is that it is only sensitive for the magnetic field component orthogonal to the semiconductor surface in which the Hall plate has been integrated (Z-axis field). Another disadvantage is that the offset may be present not only due to process dependent variations, misalignments, etc., but also due to the effects of mechanical stress (due to the piezoresistive effect), self-heating, external temperature, etc. This can make it difficult to compensate the offset under all conditions and operational variations during its lifetime.

In addition, other different types of Lorentz-force based silicon sensors are known. An advantage of such sensors is that they are sensitive in the x-axis and/or y-axis, like magneto-transistors, field-effect transistors, and multiple-output terminal Hall resistors.

Some applications of magnetic field sensors may require that the sensor provides an output signal that is directly proportional to the magnetic flux density or magnetic field strength. In such cases, an unwanted sensor characteristic may be that the output is not at a predetermined value, e.g. zero, when the field strength is zero.

For magnetic sensors with x- and y-channels it may be advantageous for the current gain to be identical in each channel, but this is not always the case. Also the current gain between different emitters and collectors of a sensor channel may be different. These differences may result in differences between both collector currents of one sensor axis. As these differences are not caused by a magnetic field, they may cause a differential output current (sensor output signal) when a field is absent (i.e. $B_x=0$, $B_y=0$). This output current may be considered to be the response of the magnetic sensor assembly when there is no magnetic field present. In two-dimensionally sensitive sensors, or sensors having two mutually orthogonal single-axis sensors on one die, the offsets may be uncorrelated. Therefore, a sensor typically needs to be calibrated at zero-field for each of its sensitive axes. This will in general imply the measurement of the offset and compensation of the resulting output signal at zero-field.

Metz et al. ("Low-offset CMOS magneto-transistor with emitter-collector switching", Proc. Transducers '99, Sendai, Japan, Jun. 7-10, 1999, pp. 88-91) discloses a CMOS magneto-transistor comprising two regions each functioning as emitter or collector regions, wherein operation of each region as emitter and collector is switched periodically.

Metz and Baltes, "Offset in CMOS magneto transistors—Part Two: reduction", IEEE transactions on electron devices, volume 48(9) 1 Sep. 2001, discloses methods to reduce offsets in CMOS magneto-transistors.

WO 2009/050673 discloses a magnetic field sensor in which, in the presence of a magnetic field, an emitter current is directed unequally between two collect accounts.

It is an object of the invention to address one or more of the above mentioned problems. The listing or discussion of a prior-published document or any background in this specification should not necessarily be taken as an acknowledgement that the document or background is part of the state of the art or is common general knowledge. One or more aspects/embodiments of the present disclosure may or may not address one or more of the background issues.

One or more embodiments of the present invention can avoid or reduce a requirement for factory calibration by performing in-situ calibration when in use. Such a solution also allows embodiments of the invention to compensate for transient mismatch which may not be achievable with factory calibration.

In particular, one or more embodiments of the invention can solve the common technical problem of determining an offset current in order to enable improved magnetic field sensing.

In accordance with a first aspect of the invention, there is provided a governing circuit for a magneto-transistor, the magneto-transistor comprising a first and second collector, at least one emitter and at least one base, wherein the governing circuit is configured to:

measure a first calibration current at the first collector of the magneto-transistor and a second calibration current at the second collector of the magneto-transistor, while a calibration base-emitter voltage is applied to the magneto-transistor.

The governing circuit may also be configured to:

measure a first measurement current at the first collector of the magneto-transistor and a second measurement current at the second collector of the magneto-transistor, while a measurement base-emitter voltage is applied to the magneto-transistor, wherein the measurement base-emitter voltage is different from the calibration base-emitter voltage; and optionally determine an output signal indicative of an applied magnetic field using the measured first and second measurement currents and first and second calibration currents.

The governing circuit may be used with some prior art magneto-transistors. Prior art devices may be refurbished to use the governing circuit. Some embodiments of the governing circuit of the present invention do not require factory calibration. Some embodiments of the present invention enable the collector current at a first and second collector to be measured simultaneously That is, embodiments of the present invention may enable a relative offset current to be determined without the need to independently measure signals at terminals of the transistor.

The first and second calibration currents may be substantially insensitive to an applied magnetic field. This insensitivity may be due to the selection of the calibration base-emitter voltage. The insensitivity to the applied magnetic field allows a relative offset to be determined that is not a function of magnetic field, or is only a weak function of the magnetic field. The measurement base-emitter voltage may be higher than the calibration base-emitter voltage.

The governing circuit may be further configured to determine a relative offset current from the first and second calibration currents. The governing circuit may be further configured to determine the relative offset current at the calibration base-emitter voltage, $\Delta I_{rel\_off}(U_{cal})$, using the formula:

$$\Delta I_{rel\_off}(U_{cal})=[I_{c1}(U_{cal})-I_{c2}(U_{cal})]/[I_{c1}(U_{cal})+I_{c2}(U_{cal})],$$

where $I_{c1}(U_{cal})$ is the first calibration current, $I_{c2}(U_{cal})$ is the second calibration current.

The governing circuit may be further configured to account for a change in the relative offset between the calibration base-emitter voltage and the measurement base-emitter voltage.

The governing circuit may be further configured to multiply the relative offset current by a correction factor in order to account for a change in the relative collector current offsets at the calibration base-emitter voltage and at the measurement base-emitter voltage. The correction factor may be empirically determined or determined by calibration. The correction factor can further improve the accuracy of a correction determined by the governing circuit.

The relative offset current may be substantially insensitive to change in the base-emitter voltage. That is, the relative offset current at the calibration base-emitter voltage, $\Delta I_{rel\_off}(U_{cal})$, may be substantially the same as the relative offset current at the measurement base-emitter voltage, $\Delta I_{rel\_off}(U_{mes})$.

The output signal indicative of the applied magnetic field may be a corrected output current, $\Delta I_{out}$, related to an uncorrected current, $\Delta I_{uncorr}$. In some embodiments the governing circuit may be further configured to provide an analogue voltage signal proportional to the corrected output current. Alternatively, the governing circuit may be further configured to provide a digital signal proportional to the corrected output current.

The uncorrected current, $\Delta I_{uncorr}$, may be equal to the difference between the first measurement current, $I_{c1}(U_{mes})$, and the second measurement current, $I_{c2}(U_{mes})$. The corrected output current, $\Delta I_{out}$, may be calculated using the formula $$\Delta I_{out}=\Delta I_{uncorr}-\Delta I_{rel\_off}*[I_{c1}(U_{mes})+I_{c2}(U_{mes})].$$

The magneto-transistor may have a first and second emitter. The governing circuit may be further configured to apply the same base-emitter potential between the first emitter and the base and the second emitter and the base. The magneto-transistor may have a first and second base. The governing circuit may be further configured to apply the same base-emitter potential between the first emitter and the first base and the second emitter and the second base.

In accordance with another aspect of the invention there is provided a magnetic sensor assembly comprising any governing circuit disclosed herein and a semiconductor layer having a first collector, a second collector, a first emitter and a second emitter.

The semiconductor layer may comprise a magneto-transistor. Alternatively, the semiconductor layer may comprise two magneto-transistors or several magneto-transistors.

In accordance with another aspect of the invention there is provided a method of operating a magneto-transistor comprising a first and second collector, at least one emitter and at least one base, the method comprising:

measuring a first calibration current at the first collector of the magneto-transistor and a second calibration current at the second collector of the magneto-transistor, while applying a calibration base-emitter voltage to the magneto-transistor.

The method may further comprise the steps of:

measuring a first measurement current at the first collector of the magneto-transistor and a second measurement current at the second collector of the magneto-transistor, while applying a measurement base-emitter voltage to the magneto-transistor, wherein the measurement base-emitter voltage is different from the calibration base-emitter voltage; and optionally determining an output signal indicative of an applied magnetic field using the measured first and second measurement currents and first and second calibration currents.

In accordance with another aspect of the invention there is provided a computer program configured to perform any method described herein.

In accordance with another aspect of the invention there is provided a magnetic sensor assembly comprising
  a semiconductor layer having a first collector and a second collector, a first emitter and a second emitter; and
  a governing circuit configured to control and measure current flow independently between the first collector and first emitter in a first direction, and between the second collector and second emitter in a second opposing direction.

By controlling and measuring current flow independently, an offset value can be determined without knowledge of the magnetic field strength or having to ensure that the magnetic field strength is zero when performing an offset measurement in a calibration mode. The offset value can be considered to represent the response of the magnetic sensor assembly, in a sensor mode, in the absence of a magnetic field.

In preferred embodiments the first and second emitters are located between the first and second collectors. Alternatively, the first and second collectors may be located between the first and second emitters. In each case, the emitters are configured to emit charge carriers which will be received by the collectors. The first emitter and the first collector are configured such that current will flow in a first direction between the first emitter and the first collector. The second emitter and the second collector are configured such that current will flow in a second opposing direction between the second emitter and the second collector. That is, the second opposing direction is in the opposite direction, i.e. at 180°, relative to the first direction.

The magnetic sensor may comprise an insulator layer between an underlying substrate and the semiconductor layer. For example, the magnetic sensor assembly may comprise silicon on insulator technology, wherein the semiconductor layer is electrically isolated from an underlying substrate by an insulator such as silicon dioxide and/or sapphire. This may prevent or restrict current from passing from the semiconductor layer to the substrate and allow a value for current gain to be determined more accurately.

The first emitter and first collector may form part of a first transistor. The second emitter and second collector may form part of a second transistor. The first and second transistor may be, for example, a field effect transistor or a bipolar junction transistor.

The first emitter and first collector may be arranged to be substantially symmetrical with the second emitter and second collector about a symmetry plane between the first and second emitters.

The governing circuit may be configured to enable current flow at the first emitter independently from the second emitter. This may be achieved by having the first and second emitters separated along the surface of the semiconductor layer by an insulating region. The insulating region may form part of a base region common to the first and second transistors.

The semiconductor substrate may comprise a first control region located between the first collector and the first emitter. The semiconductor substrate may comprise a second control region located between the second collector and the second emitter. The governing circuit may be configured to govern current flow to and from the control regions. A control region may be one of a base and a gate, depending on the type of transistors making up the sensor assembly. The control regions may allow the current gains between the collectors and emitters to be adjusted. This may enable the sensitivity of the magnetic sensor assembly to be adapted.

The first and second emitters may be spatially separate regions in a common semiconductor layer. Having separate first and second emitters may allow each emitter to emit independently, allowing more control over the magnetic sensor assembly. The first and second emitters may be spatially separated by a region of different composition to that of the first and second emitters. The different composition region may be an insulator region and/or a control region. The first and second emitters may alternatively be contiguous regions in the semiconductor layer.

The first emitter, second emitter, first collector, second collector, first control region and/or second control region may be located on a common surface of the semiconductor layer.

The governing circuit may be configured to enable current flow at the first control region independently from at the second control region.

The semiconductor layer may comprise a combination of one or more of an n-type or p-type semiconductor, silicon, doped silicon, n-doped silicon, p-doped silicon, germanium, gallium arsenide, gallium nitride and silicon carbide.

The emitters may be configured to emit charge carriers in the form of holes or electrons.

The governing circuit may comprise a first and second controlled current source connected to the first and second emitters respectively. The controlled current source may be controlled to adjust the output current in response to a determined offset value.

The semiconductor layer may comprise a bipolar magneto-transistor, a magnetic field sensitive MOSFET, a magnetic field sensitive junction FET, or a Hall resistor. The semiconductor layer may have its main axis of magnetic sensitivity parallel to the semiconductor surface. The semiconductor layer may have its main axis of magnetic sensitivity in a direction parallel to the symmetry plane and to the plane of the semiconductor surface. The collectors may be connected to the governing circuit by switches. The governing circuit may comprise biasing and readout circuitry and/or a processor. The collector may be a drain.

The emitter may be connected by switches to at least one bias current source of the governing circuit. The collectors may be connected to the governing circuit, for example the biasing and readout circuitry, by collector switches.

The magnetic sensor assembly may be manufactured in a Complementary Metal-Oxide-Semiconductor (CMOS) process, in which the substrate may be an insulator, or have an insulation layer between the substrate and the active semiconductor layer, such as silicon-on-insulator (SOI).

The governing circuit may be configured, in a calibration mode, to: apply a current between the first emitter and the first collector to determine a first calibration current value; apply a current between the second emitter and the second collector to determine a second calibration current value; and determine the difference between the first and second calibration current values, thereby determining an offset value for use in a sensor mode.

The governing circuit may be configured to:
apply and/or measure a current between the first emitter and the second collector; and/or
apply and/or measure a current between the second emitter and the first collector.

Measuring the currents between the first emitter and the second collector and/or between the second emitter and the first collector may enable a more accurate offset determination.

Applying a current between an emitter and a collector of a transistor may be enabled by biasing the transistor. Biasing a transistor may be performed by providing a current source at the emitter and a voltage (e.g. a fixed voltage) at the base. It will be appreciated that there may be other methods of biasing a transistor. For example, a voltage may be applied between the emitter and the collector.

The first calibration current value may be stored on a first storage capacitor of the governing circuit. The second calibration current value may be stored on a second storage capacitor of the governing circuit. The first and second calibration current values may comprise values for current gain, voltage, collector current and/or drain current.

Values, such as the first and second calibration current values, offset values and/or sensed current values, may be digital or analogue values. A digital value may be converted to an analogue value using a digital to analogue convertor (DAC). An analogue value may be converted to a digital value using an analogue to digital convertor (ADC).

The magnetic sensor assembly may comprise:
a first analogue to digital convertor configured to convert an analogue first calibration value to a digital first calibration value;

a second analogue to digital convertor configured to convert an analogue second calibration value to a digital second calibration value;

wherein the apparatus is configured to determine the offset value from the digital first calibration value and the digital second calibration value.

The difference between the first calibration value and the second calibration value may be determined using an offset differential amplifier of the governing circuit.

The governing circuit may comprise a first controlled current source connected to the first emitter; and/or a second controlled current source connected to the second emitter. The feedback loop may be configured to control at least one of the controlled current sources, in the sensor mode, such that the current provided is adjusted according to the offset value.

The governing circuit may be configured to determine a value for the magnetic field from the sensor output value using a conversion formula or a conversion table. The conversion formula may comprise a list of sensor output values and corresponding magnetic field values. The conversion formula may include terms for the sensitivity of the magnetic sensor assembly.

The magnetic sensor assembly may comprise:
a third collector and a fourth collector; and
a third emitter and a fourth emitter,
wherein the governing circuit is configured to control and measure current flow independently between the third collector and third emitter in a third direction, and between the fourth collector and fourth emitter in a fourth direction, the fourth direction being opposite to the third direction.

The first and second collectors may be arranged along a first collector axis, such that they probe the magnetic field in a first magnetic field axis. The third and fourth collectors may be arranged along a second collector axis, such that they probe the magnetic field in a second magnetic field axis. The first magnetic field axis may or may not be orthogonal to the second magnetic field axis.

The semiconductor layer may comprise a first lateral bipolar magneto-transistor.

In accordance with a further aspect of the invention there is provided a method of operating a magnetic sensor, the magnetic sensor assembly comprising:
a semiconductor layer having a first collector and a second collector, a first emitter and a second emitter located between the first and second collectors; and
a governing circuit configured to control and measure current flow independently between the collectors and emitters,
the method comprising a calibration mode where the governing circuit:
applies a current between the first emitter and the first collector to determine a corresponding first calibration current value;
applies a current between the second emitter and the second collector to determine a corresponding second calibration current value; and
determines a difference between the first and second calibration current values, thereby determining an offset value for use in a sensor mode.

The first and second calibration current values may be measures of current gain.

The governing circuit may control and measure current flow independently between the each of the first and second collectors and the emitters. That is, the device may be configured such that current passes from one or both of the first and second emitters to the first collector only, and such that current passes from one or both of the first and second emitters to the second collector only.

The term 'gain' used herein is intended to encompass the transfer of current from an input terminal current (e.g. emitter) to an output terminal current (e.g. collector). Gain may be expressed mathematically as the ratio of the output terminal current to the input terminal current. Values of gain may be less than one (i.e. where the output current is less than the input current), greater than one (where the output current is greater than the input current) or equal to one (where the input and output currents are the same).

By calculating an offset value, the magnetic sensor array may more accurately compensate for effects of the offset when determining a magnetic field strength in a sensor mode.

The method may comprise a sensor mode where the governing circuit:
provides a current at the first emitter and the second emitter;
determines a first sensed current value at the first collector and a second sensed current value at the second collector; and
determines a value for the magnetic field from the first sensed current value, the second sensed current value and the offset value.

The current provided to the first emitter and/or second emitter, in the sensing mode, may be adjusted according to the determined offset value.

The magnetic sensor assembly may be configured to alternate between the sensor mode and the calibration mode in a cyclical manner. Alternatively or additionally the sensor mode and the calibration mode may be activated by a user or according to a predetermined schedule.

No special mask design may be required to use offset compensation methods in accordance with embodiments of the invention.

Embodiments of the invention may not, in principle, require knowledge of the root cause of transistor mismatch (relative offset).

Sensors as described herein may be used as magnetic sensors, and specifically as 360 degree sensors. Such components may be of use, for example, in the automotive industries.

The present disclosure includes one or more corresponding aspects, embodiments or features in isolation or in various combinations whether or not specifically stated or claimed in that combination or in isolation. Corresponding means for performing one or more of the discussed functions are also intended to be within the present disclosure.

Corresponding computer programs for implementing one or more of the methods disclosed are also within the present disclosure and encompassed by one or more of the described embodiments.

The present disclosure may be considered to provide a sensor design and a method to fully, or at least partially, compensate for an offset signal. It may be used to compensate for the offset under circumstances of temperature, mechanical stress, degradation during its lifetime, etcetera, while a magnetic field is present.

A description is now given, by way of example only, with reference to the accompanying drawings, in which:

FIG. 12 shows a method in accordance with embodiments of the invention;

Figure 1A:
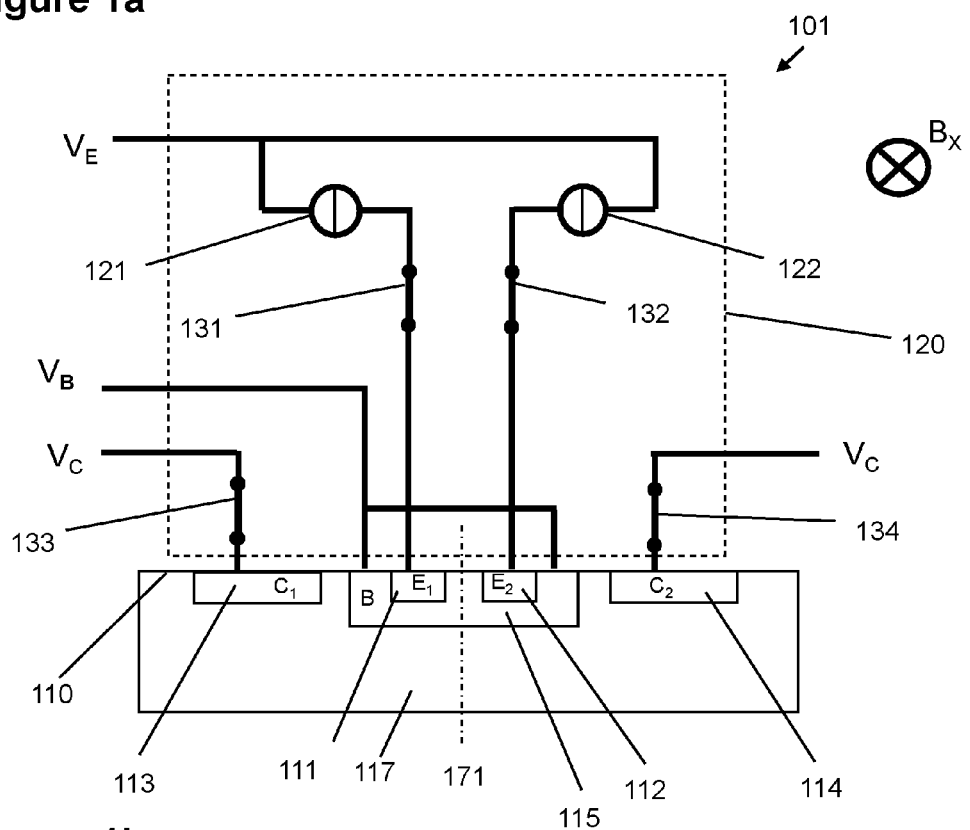
FIG. 1a is a schematic of an embodiment of a magnetic sensor assembly comprising a semiconductor layer and a governing circuit.

FIG. 1a illustrates a cross section of a magnetic sensor assembly 101 comprising an n-type silicon semiconductor layer 117. The semiconductor layer 117 comprises a first emitter 111 and a second emitter 112, and a first collector 113 and a second collector 114. The first emitter 111 and the second emitter 112 are located between the first collector 113 and the second collector 114. This embodiment also comprises a control region 115 which in this case is a base control region. The base control region 115 is a p-type region within which the n-type first emitter 111 and the n-type second emitter 112 have been formed. In this embodiment, the first emitter 111 is spatially separated from the second emitter. That is, there is a region of different composition to that of the first and second emitters situated between the first and second emitters 111, 112. The region of different composition in this case is part of the base control region 115. The first and second collectors 113, 114 are, in this case, n-type. The first emitter 111 and first collector 113 form part of a first bipolar junction transistor, and the second emitter 112 and the second collector 114 form part of a second bipolar transistor. The emitters, collectors and control region are all located on a semiconductor layer surface 117. This may make manufacture easier, for example using metal-oxide-semiconductor (MOS) techniques. In this embodiment the bipolar transistors are of npn type. It will be appreciated that other embodiments may comprise pnp type transistors.

The emitters 111, 112 and collectors 113, 114 in this embodiment are arranged substantially symmetrically about a symmetry plane 171 normal to a collector axis connecting the first and second collectors and between the first and second emitters 111, 112. This structure may be considered to have a vertical injection pattern. That is, carrier injection from the emitters 111, 112 is mainly vertical (i.e. perpendicular to the surface) and the carriers travel through the base region 115 into the collector region in a vertical direction. In the region between the base 115 and the collectors 113, 114, the charge carriers travel laterally due to the biasing of the transistor. The lateral current flow between the first emitter 111 and the first collector 113 is in a first direction, and the current flow between the second emitter 112 and the second collector 114 is in a second opposing direction.

In this case, the magnetic sensitivity of the sensor is based on minority carrier deflection. It will be appreciated that for other embodiments, the magnetic sensitivity may be based on majority carrier deflection, on electron deflection and/or on hole deflection. The semiconductor layer 117 in this case is sensitive to magnetic field components in a magnetic field axis parallel to the semiconductor layer surface 110, and to the symmetry plane 171.

The magnetic sensor assembly 101 also comprises a governing circuit 120. The governing circuit 120 comprises connections to each of the base control region 115, the first and second collectors 113, 114 and the first and second emitters 111, 112. The governing circuit is configured to control and measure current flow between the emitters 111, 112 and the collectors 113, 114. In this case, the governing circuit 120 comprises current sources 121 and 122 which can be independently connected to the first emitter 111 and to the second emitter 112 respectively, using first emitter switch 131 and second emitter switch 132. In this case, the current sources 121, 122 are configured to provide an equal current $I_E/2$ to both emitters. The current sources 121, 122 are supplied by an emitter voltage $V_E$. Other embodiments may be configured to provide a different current to each emitter. In this case the governing circuit also comprises first collector switch 133 and second collector switch 134 to connect to a collector voltage $V_C$. In this embodiment, the base control region is connected to a base voltage $V_B$. Each of the base voltage $V_B$, the collector voltage $V_C$, and the emitter voltage $V_E$ may or may not correspond to an earth/ground voltage.

The governing circuit comprises measuring apparatus (not shown), for example current sensors, such as ammeters, to measure first and second collector currents. The governing circuit also comprises processing apparatus (not shown) for example, to determine output sensor values and to calculate the corresponding magnetic field.

The first emitter 111 is substantially similar to the second emitter 112 in size. In plan view, i.e. as seen from above, the first and second emitters 111, 112 may appear as two rectangles with the same orientation or as parallel stripes on the semiconductor layer surface 110 of the semiconductor substrate 117. That is, the collector and emitters may be extended along the magnetic field axis of sensitivity.

Figure 1B:
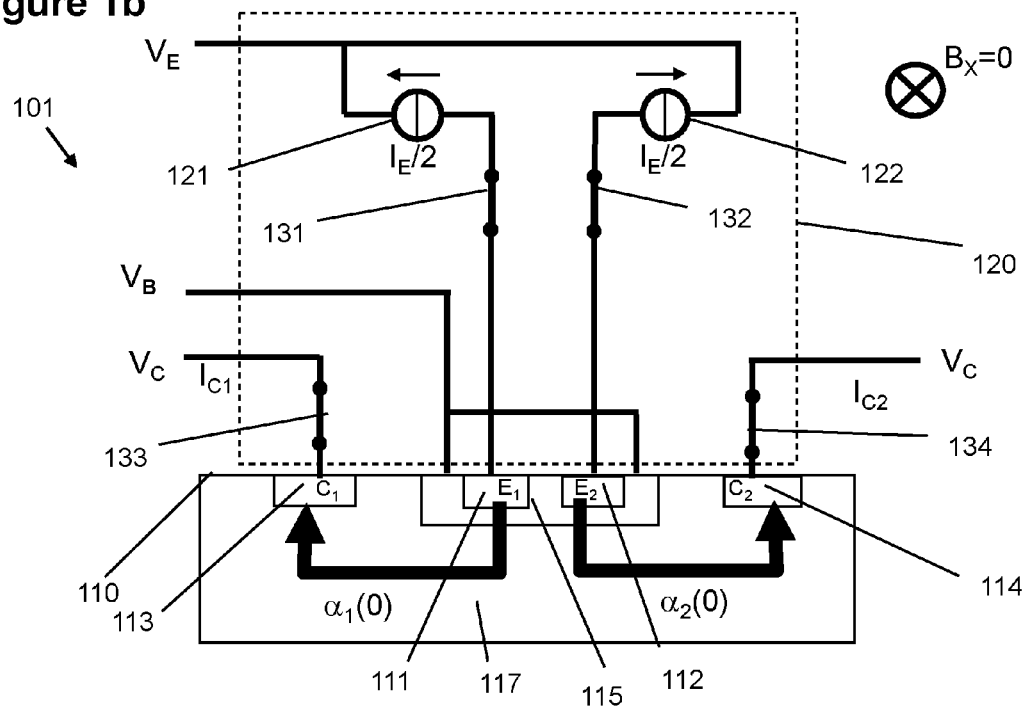
FIG. 1b depicts the embodiment of FIG. 1a in a sensor mode when the magnetic field strength is zero.

FIG. 1b depicts the embodiment 101 of FIG. 1a in a sensor mode, in which the first and second emitter switches 131, 132 are closed to allow current to flow to or from the first and the second emitters 111, 112. In this case, the first and second collector switches 133, 134 are also closed to allow current to flow to or from the first and the second collectors 113, 114. In the configuration depicted in FIG. 1b the magnetic field $B_x$ is zero, and so both emitters 111, 112 are injecting electrons, through the base control region 115, to their respective n-type first and second collectors 113, 114. Due to physical properties, such as recombination, the transfer from emitter to collector pair is not equal to one, but lower, denoted by the common-base active-region current gain α. This factor plays an important role in the present embodiment. In this embodiment, the current gains $\alpha_1(B_x)$, $\alpha_2(B_x)$ of emitter to collector (usually called the common-base, active region short-circuit current gain, transfer efficiencies) may be different (for example, due to manufacturing tolerances) for both halves when the magnetic field is zero, thereby giving rise to an offset. So, $\alpha_1(0)$ and $\alpha_2(0)$ may in general be unequal. The offset current, $I_{OFF}$, is defined as:

$$I_{OFF}(I_E) = I_{C1} - I_{C2} = (\alpha_1(0) - \alpha_2(0))I_E/2.$$

where $I_{C1}$ is the collector current at the first collector 113 and $I_{C2}$ is the collector current at the second collector 114 when the same emitter current, $I_E/2$, is supplied at the first and second emitters 111, 112.

Under normal operating conditions, for example when the magnetic sensor assembly is in a sensor mode, the value of this offset may affect the output sensor value of the magnetic sensor assembly. For example, the sensor may convert the difference in current at the first and second collectors 113, 114 to a value for the magnetic field strength using a conversion formula. If the conversion formula assumes that there is no offset or uses a value for the offset which is inaccurate, or is no longer accurate, the magnetic field strength reading may be affected.

For example, during the lifetime of the sensor, the offset may change by ageing, by temperature effects, or by mechanical distortions of the package comprising the sensor assembly. It may be difficult to compensate for these changed offset values. In addition, there may be a magnetic field acting on the sensor, ranging from the earth's magnetic field, or stray fields, to the application field e.g. of an angular sensor magnet. This can make it difficult to set or reset a sensor in a calibrated state without removing the influence of any external field. In many applications, such as those relating to automobiles, the magnetic field cannot readily be removed for recalibration. As a consequence, the offset variations may hamper a reliable, accurate sensor operation.

It would therefore be desirable to determine the value of the offset and/or compensate for the effects of the offset. However, under normal operating conditions it might be difficult to ensure that a magnetic field strength is not affecting the determined value of the offset. For example, without some other method of determining the magnetic field, it may be difficult to ensure that the magnetic field strength is zero when measuring directly the offset of the magnetic sensor assembly. Therefore, it may be desirable to be able to determine the offset regardless of, or independently from, the actual value of the magnetic field strength.

An aspect of the present disclosure is to provide a device construction for magneto-transistors (and for other dual output terminal devices) and a method to compensate the offset in a way that is also usable during the operation of the sensor in the presence of a magnetic field (or magnetic induction), or when the magnetic field strength is unknown. Any influence of mechanical stress, temperature or ageing may therefore be compensated for.

Figure 1C:
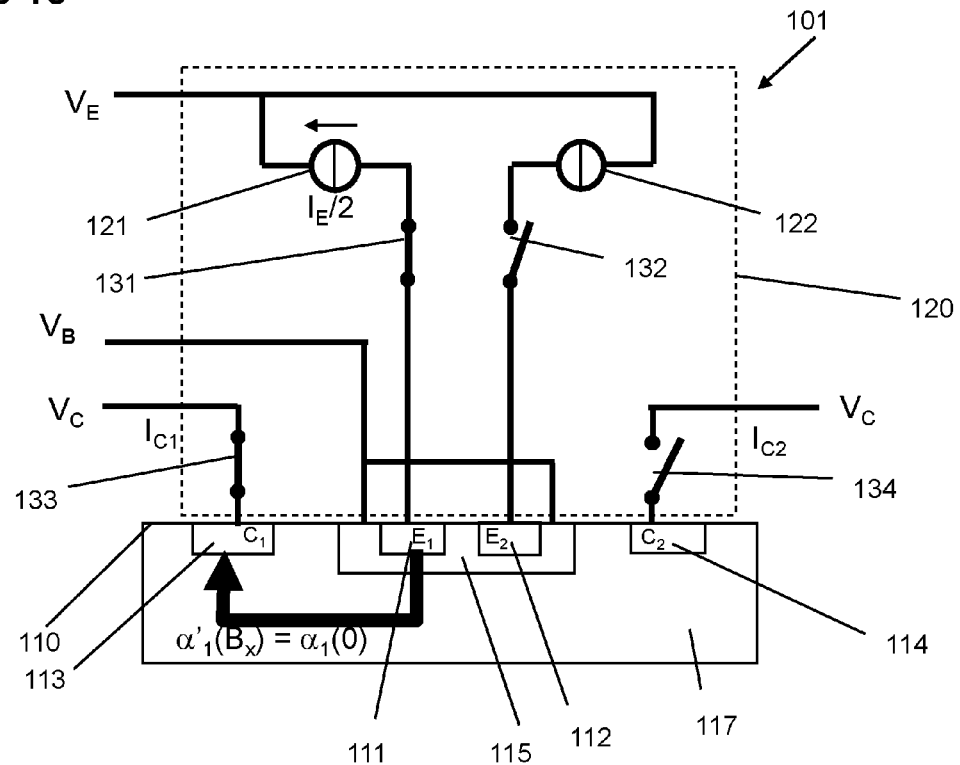
FIG. 1c depicts the embodiment of FIG. 1a in a calibration mode for determining a first calibration value.

FIG. 1c depicts a stage of an offset determining process. When the magnetic sensor apparatus is determining the offset value, it may be considered to be in a calibration mode. In this situation the magnetic field strength, $B_x$, is non-zero. It will be appreciated that the method may be used to determine the offset when the magnetic field strength is zero or is unknown.

In FIG. 1c the situation for the first transistor (depicted on the left side) is shown: The first emitter $E_1$, 111 and first collector $C_1$, 113 are connected by first emitter switch 131 and first collector switch 133 of the governing circuit 120 to the emitter voltage, $V_E$ and to the collector voltage $V_C$ respectively. The first current source 121 supplies a first emitter current of $I_E/2$ to the first emitter 111. The second emitter switch 132 is configured, in this stage, to prevent and/or restrict current from flowing to/from the second emitter 112, and the second collector switch 134 is configured to prevent and/or restrict current from flowing to/from the second collector 114. In this way, the governing circuit applies a current between the first emitter and the first collector in order to determine a first calibration value corresponding to a first calibration current gain. The output first collector current at the collector is given by $$I'_{C1} = \alpha'_1(B_x)I_E/2,$$

where $\alpha'_1(B_x)$, is the current gain where current is passing from the first emitter to the first collector in the presence of a magnetic field, $B_x$. The prime denotes that the current gain is the current gain when the sensor is in a calibration mode. The arrows depicted in the semiconductor layer of FIG. 1c show the movement of electrons.

As the influence of $B_x$ on the current gain, $\alpha'_1(B_x)$, is very small or even absent, $$\alpha'_1(B_x) = \alpha_1(0)$$

where $\alpha'_1(0)$ is the current gain when current is passed from the first emitter to the first collector in the absence of a magnetic field in the sensor mode. This is because the magnetic field cannot induce the current to flow to some other collector as that avenue is limited due to the restricted connection between the second collector and the governing circuit by second collector switch 134. For this embodiment the governing circuit is configured to determine the first collector current $I'_{C1}$ as a first calibration value corresponding to a first calibration current gain, for example using an ammeter (not shown). The governing circuit is configured to store the first calibration value in a memory.

Figure 1D:
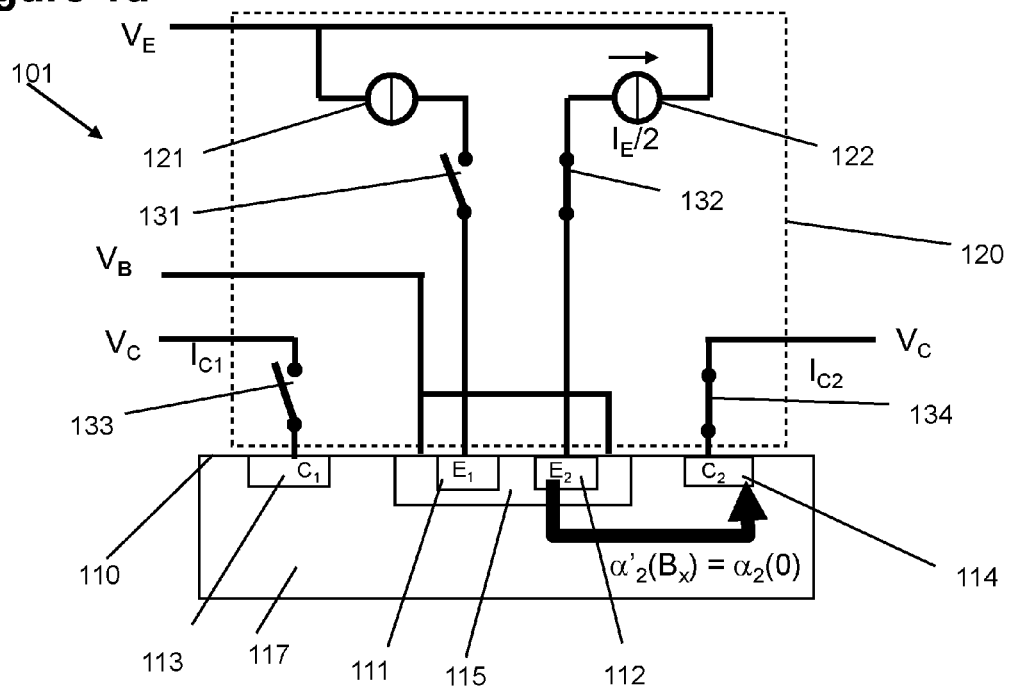
FIG. 1d shows the embodiment of FIG. 1a in a calibration mode for determining a second calibration value.

FIG. 1d depicts the corresponding situation in which the second calibration value, corresponding to the current gain for current passing between the second collector 114 and second emitter 112, can be determined. In this situation the second emitter $E_2$, 112 and second collector $C_2$, 114 are connected by switches 132, 134. Current is restricted from flowing between the first emitter and the second emitter. The output second collector current is, in this case, $$I'_{C2} = \alpha'_2(B_x)I_E/2.$$

where $\alpha'_2(B_x)$, is the current gain where current is passing from the second emitter to the second collector in the presence of a magnetic field, $B_x$. The prime denotes that the current gain is the current gain when the sensor is in a calibration mode.

As the influence of $B_x$ on the current is very small or even absent, $$\alpha'_2(B_x)=\alpha_2(0).$$

where $\alpha_2(0)$, is the current gain when current is passed from the second emitter to the second collector in the absence of a magnetic field in the sensor mode. In this way the governing circuit applies a current between the second emitter and the second collector in order to determine a corresponding second calibration value corresponding to a second calibration current gain. For this embodiment the governing circuit 120 is configured to determine the second collector current $I'_{C2}$ as a second calibration value corresponding to a second calibration current gain for example using an ammeter (not shown).

Using the first and second collector current calibration values of FIG. 1c and FIG. 1d, the differential current, or offset current, may be determined, for example using a processor of the governing circuit (not shown):

$$I'_{C1}-I'_{C2}=(\alpha'_1-\alpha'_2)I_E/2=(\alpha_1(0)-\alpha_2(0))I_E/2\equiv I_{OFF}$$

This differential current corresponds to the offset current. This result is valid when $|B_x|\geq 0$.

In this way the governing circuit determines the difference between the first calibration value and the second calibration value, thereby determining an offset value for use in a sensor mode. It will be appreciated that the first and second calibration values may be determined using ammeters and stored and processed using a memory and a processor.

So, the offset may be determined, independently of the actual magnetic field strength, under normal operation conditions. It will be appreciated that other embodiments may be configured to alternate sequentially between calibration mode and sensor mode operation, or to periodically enter the calibration mode to determine the offset value for subsequent sensor mode measurements. It will be appreciated that the calibration mode, and the sensor mode, may be activated manually, for example, by a user.

Figure 1E:
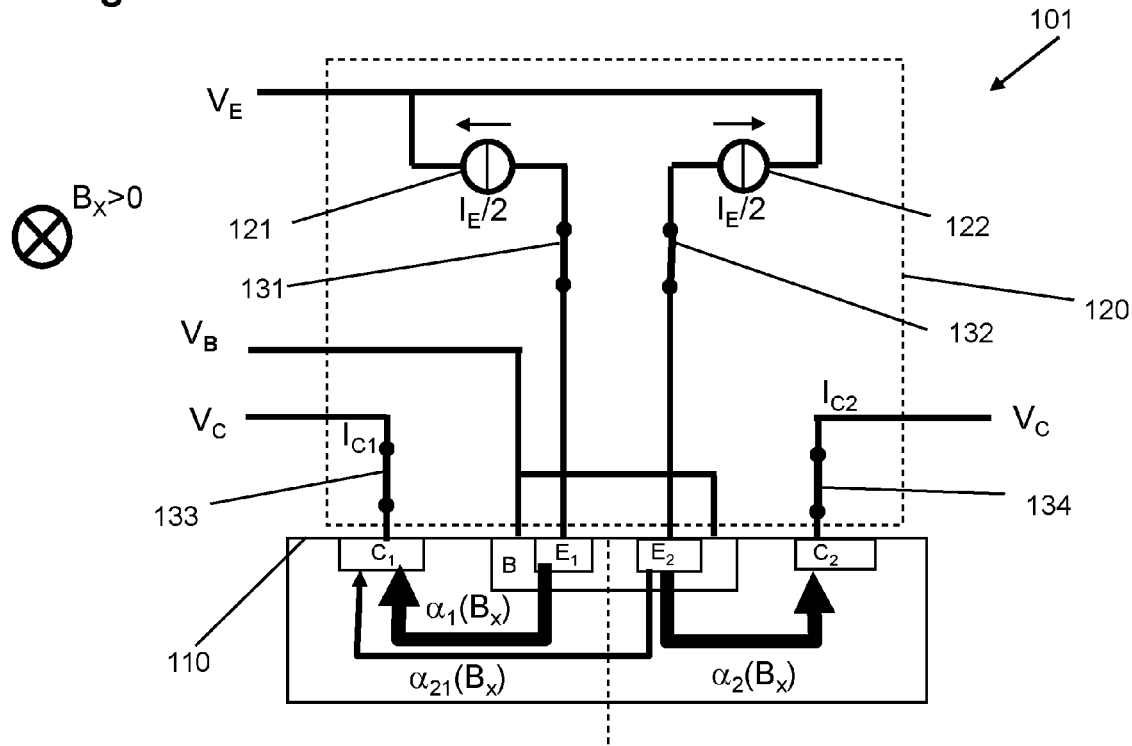
FIG. 1e illustrates the embodiment of FIG. 1a in a sensor mode when the magnetic field strength has a first polarity.
Figure 1F:
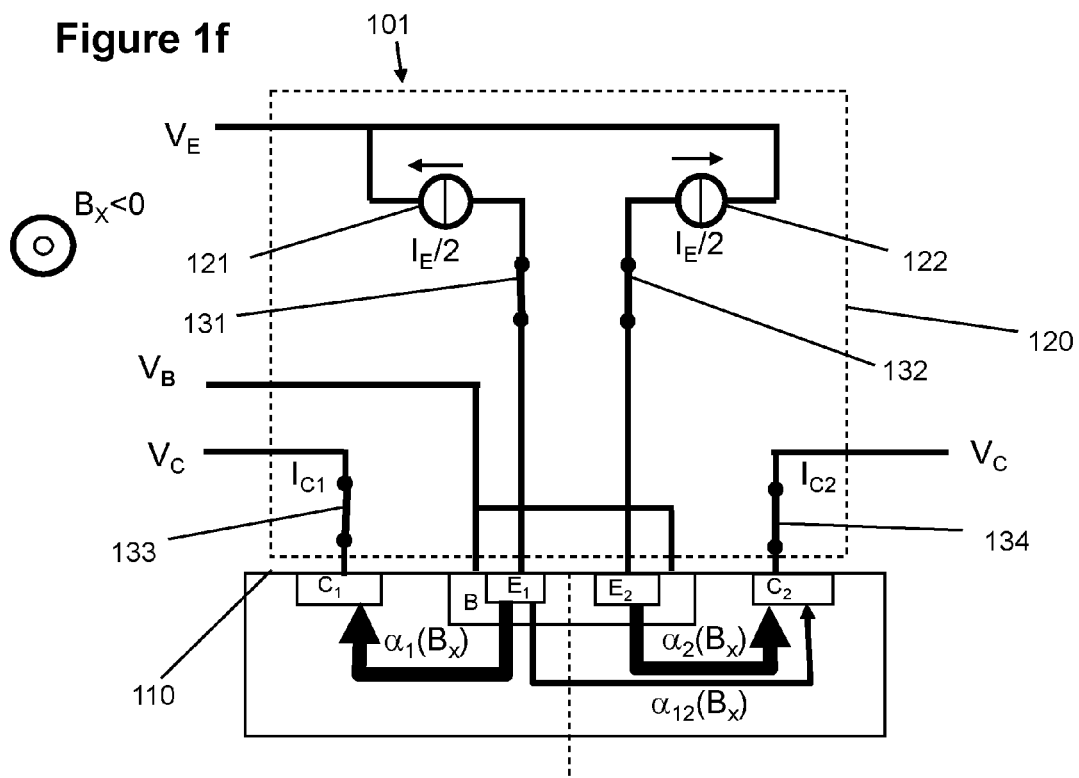
FIG. 1f shows the embodiment of FIG. 1a in a sensor mode when the magnetic field strength has a second polarity.

The sensor mode of operation as a sensor of the magnetic sensor assembly of FIG. 1a is shown in FIGS. 1e and 1f for two field polarities, respectively. In FIG. 1e, the field $B_x$ is positive (going into the plane of the page). In the sensor mode both emitters and both collectors are connected by collector and emitter switches 131, 132, 133, 134. The current sources 121, 122 are providing an emitter current of $I_E/2$ to each of the first and second emitters 111, 112. The magnetic field introduces an additional component of current gains compared with the situation depicted in FIG. 1b. The additional component is the crosstalk current from second emitter to first collector, characterized by $\alpha_{21}(B_x)$, which describes the current gain of the current passing between the second emitter and the first collector in a sensor mode. In the situation, the output first collector current at the first collector can be expressed as:

$$I_{C1}=(\alpha_{21}(B_x)+\alpha_1(B_x))I_E/2$$

$$I_{C2}=\alpha_2(B_x)I_E/2$$

The differential sensed current between the first and second collectors is given by:

$$I_{raw}=I_{C1}-I_{C2}=(\alpha_{21}(B_x)+\alpha_1(B_x)-\alpha_2(B_x))I_E/2=(\alpha_{21}(B_x)+\alpha_1(0)-\alpha_2(B_x))I_E/2.$$

As $$\alpha_{21}(B_x)+\alpha_2(B_x)=\alpha'_2(B_x)=\alpha_2(0),$$

it can be deduced that:

$$\alpha_2(B_x)=\alpha_2(0)-\alpha_{21}(B_x).$$

The difference between the sensed currents at the first and second collectors is given by the sensed current value difference:

$$I_{raw}=I_{C1}-I_{C2}=(2\alpha_{21}(B_x)+\alpha_1(0)-\alpha_2(0))I_E/2,$$

and is determined using a processor of the governing circuit 120.

When the offset current from the previous steps (FIGS. 1c and 1d) is subtracted from the output current, using for example a processor (not shown) of the governing circuit 120, the resulting calibrated output sensor current, $I_{out}$, is:

$$I_{out}=I_{raw}-I_{OFF}=\alpha_{21}(B_x)I_E \text{ for } B_x>0$$

This allows the offset to be compensated for. As there may not be any crosstalk from the first emitter to the second collector or vice versa when the applied magnetic field is zero, the output sensor current will be, under these conditions:

$$I_{out}=\alpha_{21}(0)I_E=\alpha_{12}(0)I_E=0 \text{ for } B_x=0$$

For completeness, FIG. 1f shows the situation for $B_x<0$. Using the same offset-current definition and measurements from FIGS. 1c and 1d, the differential output current for this case is:

$$I_{out}=-\alpha_{12}(B_x)I_E \text{ for } B_x<0$$

For small values of $B_x$ it may be assumed that $\alpha_{12}(B_x)$ equals $\alpha_{21}(B_x)$. This assumption has been verified by experiments. The relation between $\alpha_{12}(B_x)$ (or $\alpha_{21}(B_x)$) and the sensitivity, $S_I^\pm$, is:

$$S_I^+=I_{out}/(I_E\cdot B_x)=\alpha_{21}(B_x)/B_x(B_x>0)$$

$$S_I^-=I_{out}/(I_E\cdot B_x)=-\alpha_{12}(B_x)/B_x(B_x<0)$$

where the + and the − sensitivity superscripts denote the direction, or polarity, of the magnetic field.

It will be appreciated that this method may not be limited to dual-output terminal npn-type bipolar magneto-transistors, but also holds for dual-output terminal pnp-type bipolar magneto-transistors. The method may also be applied for dual-output terminal magneto-resistors (no base region present) of both n-type and p-type conduction.

It will be appreciated that the semiconductor layer may be positioned on an insulator layer. The leakage current from the semiconductor layer to the underlying substrate may be absent or limited in a silicon-on-insulator (SOI) based device. This may make the current gain measurements and/or current measurements more accurate, particularly in embodiments where the first and second emitters are separate. Collector currents may be measured at constant emitter-current biasing for instance.

Figure 2:
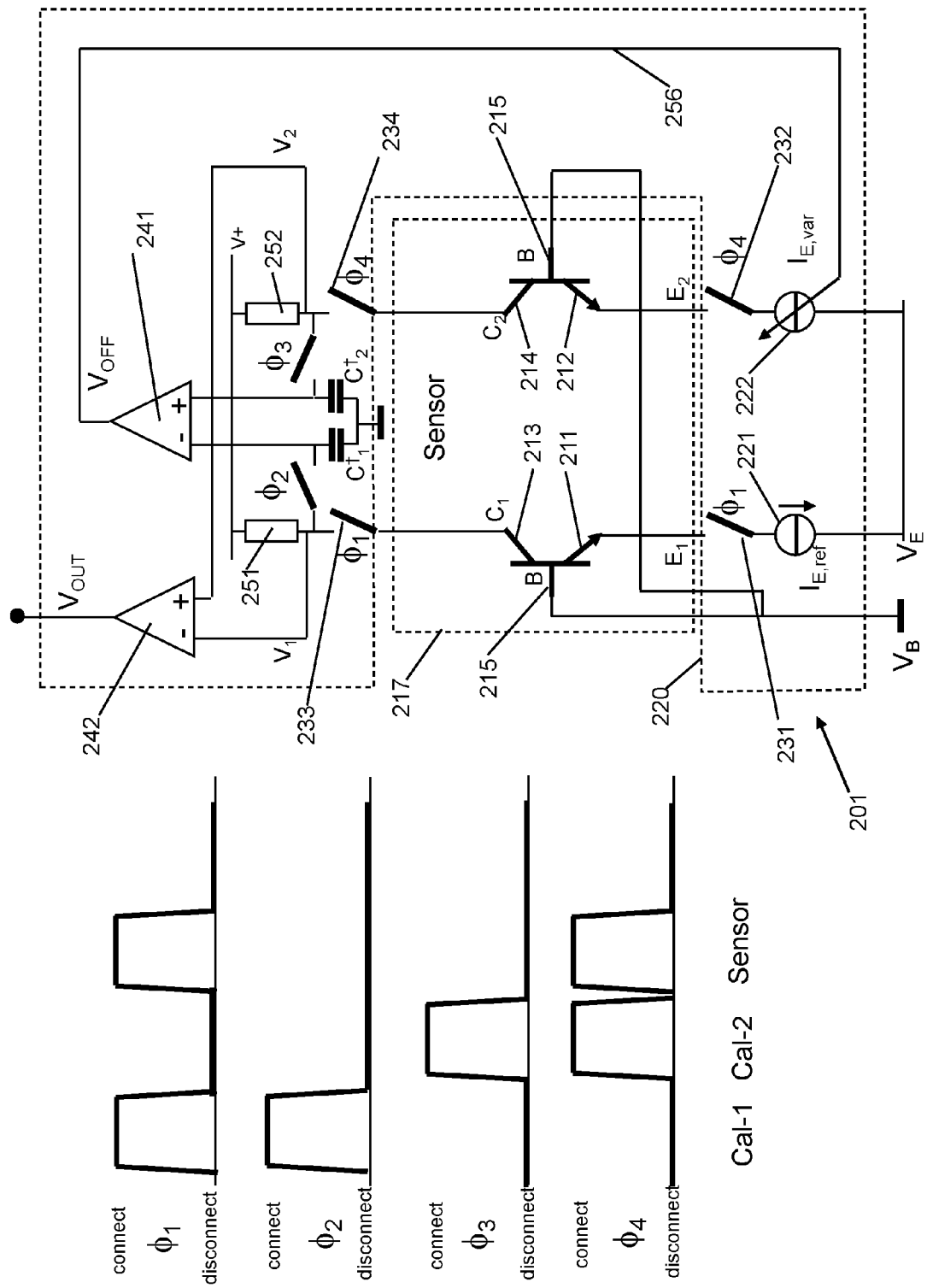
FIG. 2 depicts a further embodiment in which the governing circuit comprises a controlled current source and a feedback loop.

FIG. 2 illustrates a further embodiment of a magnetic sensor assembly. This embodiment has a semiconductor layer structure which is similar to that of the embodiment of FIG. 1a. The semiconductor layer comprises a first emitter 211 and a second emitter 212, and a first collector 213 and a second collector 214. The first emitter 211 and the second emitter 212 are located between the first collector 213 and the second collector 214 on a semiconductor layer surface 210. This embodiment also comprises a control region 215 which is a base control region. Unlike the previous embodiment, in this embodiment, the governing circuit is configured to adjust the emitter current of the second current source 222 as a function of the offset determined in the calibration mode.

The semiconductor layer (in this example a dual-collector npn-type bipolar magneto-transistor), in this case, is biased by a constant base voltage, $V_B$, e.g. at ground potential.

Switches connect various components of the magnetic sensor assembly. These switches are controlled by signals $\phi_1$, $\phi_2$, $\phi_3$, $\phi_4$. The signals corresponding to the calibration mode stages and the sensor mode are shown on the left of FIG. 2. For this embodiment, when the signal is high the corresponding switch is closed or connected and when the signal is low the corresponding switch is open or disconnected. It will be appreciated that for other embodiments these signal levels may be reversed.

The first and second emitters 211, 212 are connected through switches to their respective first and second emitter current sources 222, 221. The first emitter, $E_1$, 211, is connected to a reference first emitter current source 221 which supplies a first emitter current of $I_{E,ref}=I_E/2$ via a switch which is controlled by a signal $\phi_1$. The second emitter, $E_2$, is connected via a switch, controlled by a signal $\phi_4$, to a variable second emitter current source, $I_{E,var}$. The latter source is controlled by a signal $V_{OFF}$. Both current sources are connected to the supply rail, $V_E$, which in this case is a negative supply rail. The collectors $C_1$ and $C_2$, are connected via switches, controlled by $\phi_1$ and $\phi_4$, respectively, and first and second resistors, 251, 252, each with resistance R, to a positive supply rail, $V^+$.

It will be appreciated that for other embodiments, the control regions may be independently connected and disconnected to the base voltage $V_B$ using control region switches. The control region switches for the first and second control regions may be configured to operate in phase with $\phi_1$ and $\phi_4$ respectively.

During a first step of the calibration mode, $\phi_1$ and $\phi_2$ are high (that is, the switches are closed or connected). Then, collector $C_1$ is also connected to a first storage capacitor $C^{\dagger}_1$. The first calibration value of node voltage, $V'_1$, stored on the first storage capacitor $C^{\dagger}_1$, then is:

$$V'_1=V^+-I'_{C1}\cdot R$$

The node voltage, $V'_1$, is dependent on the first collector current, $I'_{C1}$, when in the calibration mode, which in turn is dependent on the current gain. In this way, the governing circuit determines and stores a first calibration value of voltage corresponding to the current gain. This voltage will be stored by the first storage capacitor, $C^{\dagger}_1$.

For the second calibration mode step $\phi_1$ and $\phi_2$ will be low, and $\phi_3$ and $\phi_4$ will be high. This connects the second current source to the second emitter. The second calibration value of node voltage, $V'_2$, stored on the second storage capacitor $C^{\dagger}_2$, then is:

$$V'_2=V^+-I'_{C2}\cdot R.$$

The node voltage, $V'_2$, is dependent on the second collector current, $I'_{C2}$, when in the calibration mode, which in turn is dependent on the current gain. In this way, the governing circuit determines and stores a second calibration value of voltage corresponding to the current gain. This voltage will be stored by the second storage capacitor, $C^{\dagger}_2$.

The storage capacitors $C^{\dagger}_1$ and $C^{\dagger}_2$ will now have voltages representing the first and second calibration values, $V'_1$ and $V'_2$, respectively. As the first and second storage capacitors are connected to the inputs of an offset differential amplifier 241, the voltage at the output of the offset differential amplifier, 241, will be $V_{OFF}$:

$$V_{OFF}=V'_2-V'_1=R\cdot(I'_{C1}-I'_{C2})=R\cdot I_{OFF}.$$

The offset differential amplifier, 241, of the governing circuit 220 determines the difference between the first value of current gain and the second value of current gain.

The feedback loop 256 is configured to control the second emitter current source, 222, $I_{E,var}$, to adjust the emitter current supplied such that $V_{OFF}$ will become zero. In this way the governing circuit is configured to compensate for the offset. This implies that $I_{OFF}=I'_{C1}-I_{C2}=0$. This means that:

$$I_{E,var}=I_{E,ref}\cdot(\alpha_1(0)/\alpha_2(0))=I_E\cdot(\alpha_1(0)/\alpha_2(0))/2.$$

It will be appreciated that the first step and the second step may be performed in any order. It will be appreciated that for other embodiments, a feedback loop may control the first emitter current sources as well as, or instead of, the second emitter current source.

In a third sensor mode step, the signal $\phi_3$ becomes low and fa becomes high again. The signals $\phi_3$ and $\phi_2$ disconnect the first and second collector 213, 214 from the first and second storage capacitors, $C^{\dagger}_1$ $C^{\dagger}_2$, and the offset differential amplifier 241. The signals $\phi_1$ and $\phi_4$ connect the first and second collector 213, 214 to an output differential amplifier 242. At this point in time the offset voltage that may have existed between $V'_1$ and $V'_2$ is zero. This activates the sensor mode of this embodiment and any magnetic signal that is caused by the magnetic field is causing an imbalance between the output voltages, as described above. After the output differential amplifier 242 the output $V_{OUT}$ reads (for positive direction of the magnetic field strength B):

$$V_{OUT}=R\cdot(I_{C1}(B)-I_{C2}(B))=2R\cdot\alpha_{21}(B)\cdot I_{E,var}$$

which has no offset component. It will be appreciated that, for this embodiment, the total emitter current is not fixed, but varies dependent on the existing (and possibly varying) offset:

$$I_{E,tot}=I_{E,ref}+I_{E,var}=(1+\alpha_1(0)/\alpha_2(0))\cdot I_E/2$$

This implies that the absolute output ($V_{OUT}/B$) may not be fixed and may differ slightly from sample to sample and from time to time. It will be appreciated that this embodiment may be configured to measure the total emitter current and take the total emitter current into account, for example using a conversion formula, when converting the sensor output voltage value into a value corresponding to the magnetic field strength.

Figure 3:
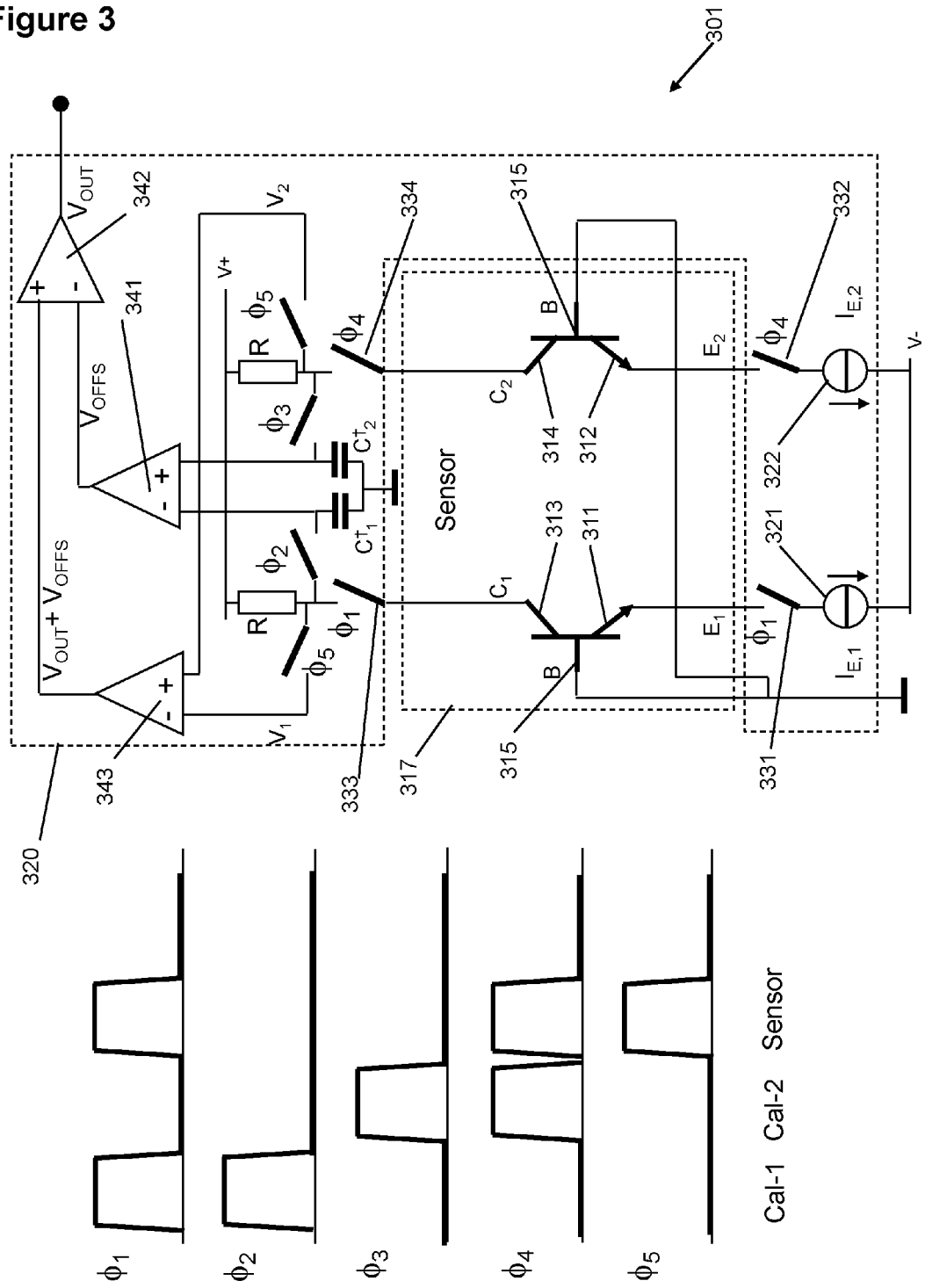
FIG. 3 shows a further embodiment in which the governing circuit comprises a differential amplifier for subtracting the offset value.

FIG. 3 gives a further embodiment of a magnetic sensor assembly. This embodiment has a semiconductor layer structure which is similar to that of the embodiment of FIG. 1*a*. The semiconductor layer comprises a first emitter 311 and a second emitter 312, and a first collector 313 and a second collector 314. The first emitter 311 and the second emitter 312 are located between the first collector 313 and the second collector 314. This embodiment also comprises a control region 315 which is a base control region. Unlike the previous embodiment, where one of the emitter currents could be adjusted as a function of the offset, in this case the total emitter current is kept constant.

Switches connect various components of the magnetic sensor assembly. These switches are controlled by signals $\phi_1$, $\phi_2$, $\phi_3$, $\phi_4$ and $\phi_5$. The signals corresponding to the calibration mode stages and the sensor mode are shown on the left of FIG. 3. For this embodiment, when the signal is high the corresponding switch is closed or connected and when the signal is low the corresponding switch is open or disconnected. It will be appreciated that for other embodiments these signal levels may be reversed.

The first and second step of the calibration mode is similar to that of the previous embodiment. A first step comprises connecting the first emitter 311 to a first emitter current source 321 using signal $\phi_1$. Signal $\phi_2$ connects the first collector 313 to a first storage capacitor $C^\dagger_1$ which results in a first calibration value of voltage, corresponding to a first calibration current gain, being stored on the first storage capacitor $C^\dagger_1$. A second step comprises connecting the second emitter 312 to a second emitter current source 322 using signal $\phi_4$. Signal $\phi_3$ connects the second collector 314 to a second storage capacitor $C^\dagger_2$ which results in a second calibration value of voltage, corresponding to a second calibration current gain, being stored on the second storage capacitor $C^\dagger_2$. The offset differential amplifier 241 in this case is not used in a feedback loop as in the previous embodiment, but supplies an output differential amplifier 342 directly with the determined difference between the first calibration value and the second calibration value.

In the sensor mode, signals $\phi_2$ and $\phi_3$ disconnect the collector outputs from the storage capacitors $C^\dagger_1$, $C^\dagger_2$. Signals $\phi_1$, $\phi_4$ and $\phi_5$ connect the collector outputs to a raw differential amplifier 343. The output of this raw differential amplifier 343 represents the difference in collector currents sensed current values before the offset value is taken into account and is given by $V_{raw}=V_{OUT}+V_{OFF}$. This raw differential amplifier 343 output is connected to the other input of the output differential amplifier 342. The output differential amplifier 342 is used to subtract the offset value from the raw value to yield $V_{OUT}$. In this embodiment, the emitter current sources $I_{E,1}$ and $I_{E,2}$ are fixed. If $I_{E,1}=I_{E,2}=I_E/2$, then for positive direction of the magnetic induction B, the output voltage is:

$$V_{OUT}=2R\cdot\alpha_{21}(B)\cdot I_E/2=R\cdot\alpha_{21}(B)\cdot I_E$$

This embodiment is configured to convert the sensor output voltage value into a value of the measured magnetic field strength using a conversion table, the conversion table comprising sensor output voltage values and corresponding magnetic field strength values. It will be appreciated that other embodiments may use a conversion factor and/or conversion formula to determine the corresponding magnetic field strength.

Figure 4A:
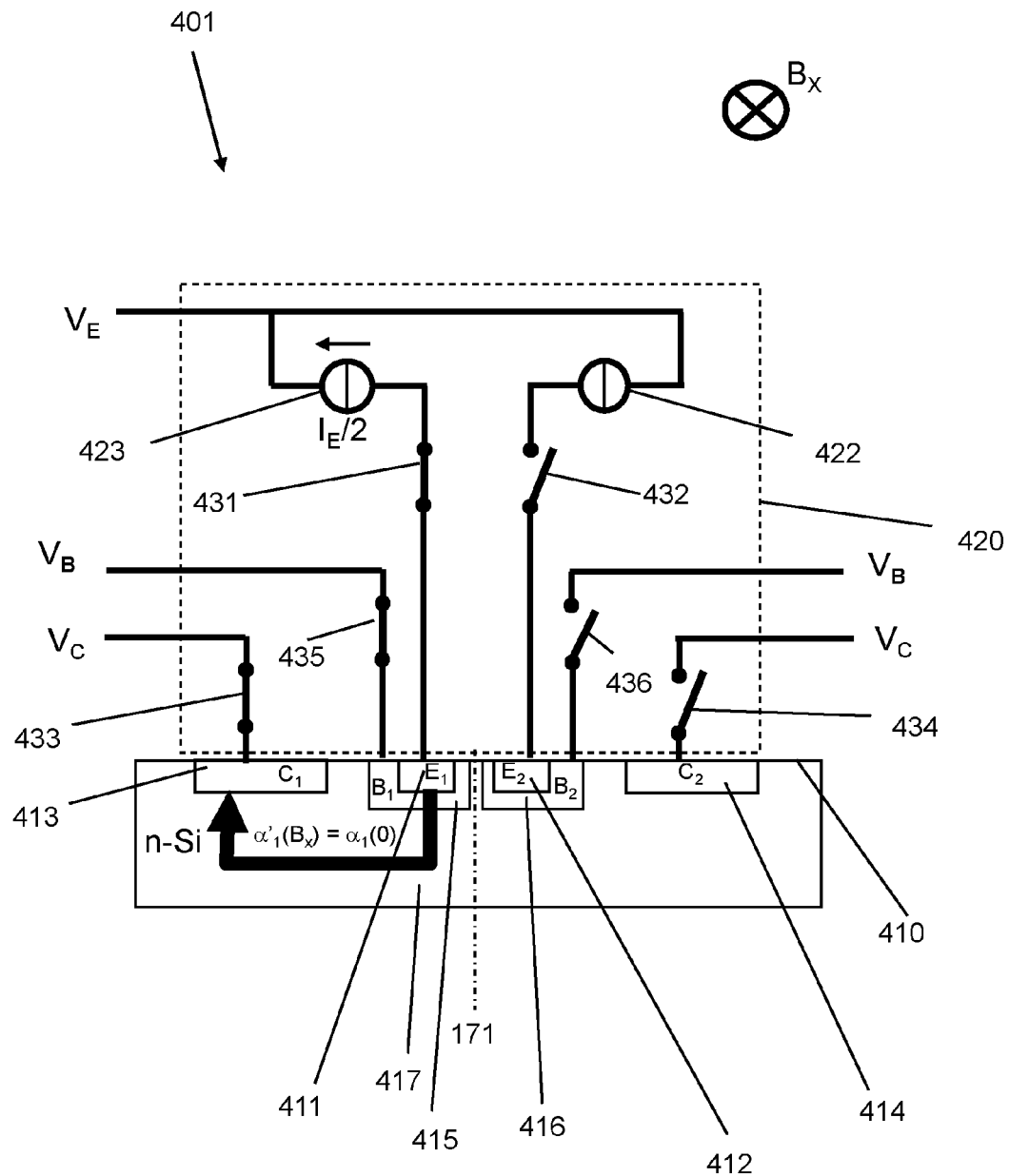
FIG. 4a illustrates a further embodiment in a calibration mode for determining a first calibration value.

FIG. 4a illustrates a further embodiment of a magnetic sensor assembly. Like the embodiment of FIG. 1, this embodiment comprises a semiconductor layer 417 comprising a first emitter 411 and second emitter 412, a first collector 413 and a second collector 414. The collectors and emitters are located on a semiconductor layer surface 410. Unlike the embodiment of FIG. 1 which comprised a single base control region, this embodiment has two spatially separate base control regions, a first base control region 415 through which current can pass from the first emitter 411 to the first collector 413, and a second base control region 416 through which current can pass from the second emitter 412 to the second collector 414. Each of the first base control region 415 and the second base control region 416 can be independently connected to a base voltage using a first control region switch 435 and second control region switch 436.

It will be appreciated that, for other embodiments, the first base control region and the second base control region may not be separate but be contiguous.

This embodiment also comprises a governing circuit 420 configured to govern circuit flow between the collectors and the emitters and to and from each of the base control regions. In this embodiment, the governing circuit 420 controls current flow to and from the first and second emitters 411, 412, first and second collectors 413, 414 and first and second base control regions 415, 416 using first and second emitter switches 431, 432, first and second collector switches 433, 434, and first and second control region switches 435, 436.

The situation depicted in FIG. 4a is when the magnetic sensor assembly is in the calibration mode in order to determine a first calibration value corresponding to the current gain between the first emitter 411 and the first collector 413. In this stage of the calibration mode, the second emitter, the second base control region and the second collector are isolated from the governing circuit using the switches 432, 434, 436. This, as well as restricting/preventing current flow to/from the second emitter 412 and to/from the second collector 414, restricts/prevents current flow from entering or exiting the semiconductor layer 417 via the second base control region 416. Other switches 431, 433, 435 connect the governing circuit to the first emitter, the first collector and the first base control region. In this way the governing circuit is configured to apply a current between the first emitter and the first collector. In this embodiment, the governing circuit is configured to determine a first calibration value corresponding to the first current gain using the ratio of the first collector current and the first emitter current, using a first emitter current ammeter, a first collector current ammeter and a processor (not shown). The first calibration value is stored in a memory.

Figure 4B:
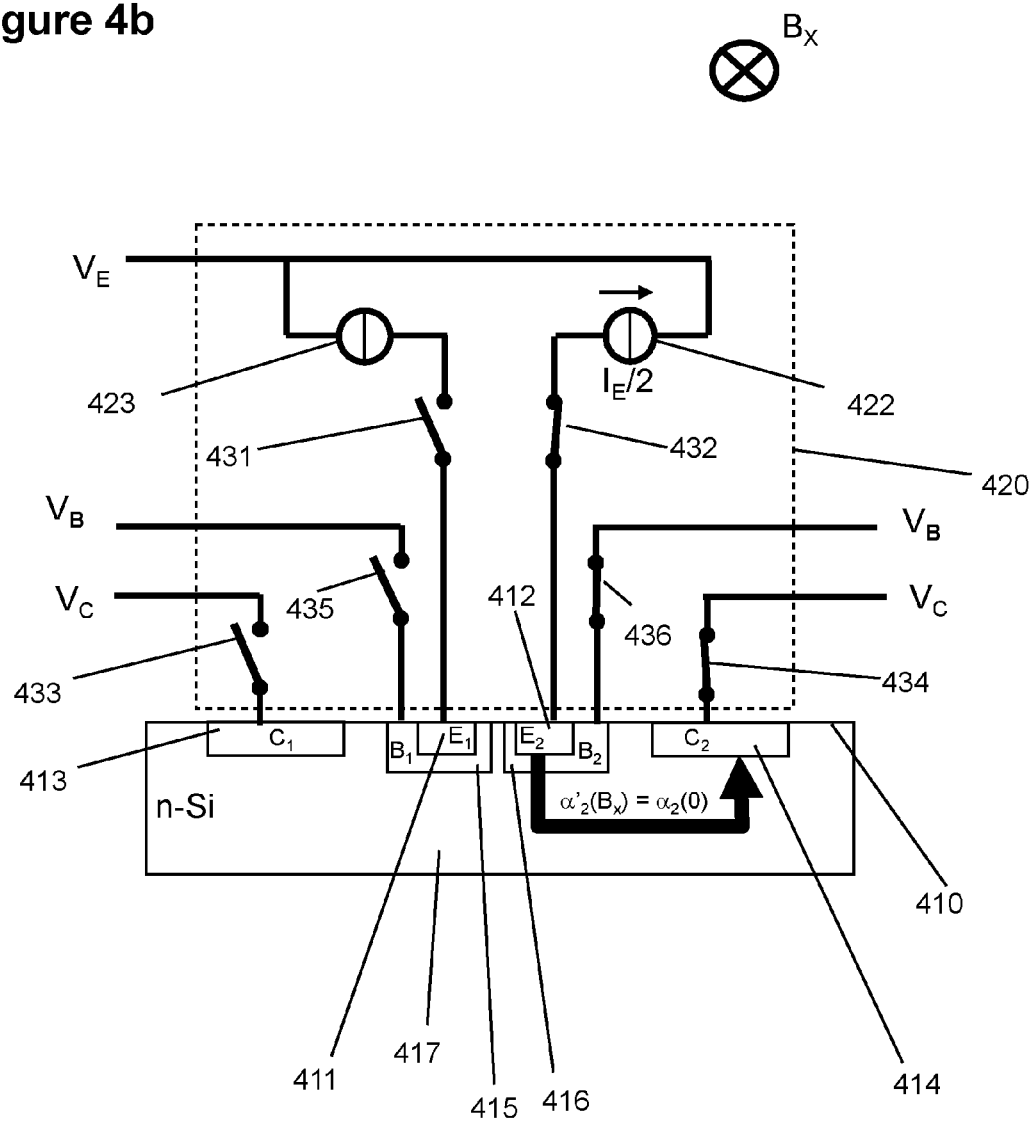
FIG. 4b shows the embodiment of FIG. 4a in a calibration mode for determining a second calibration value.

The situation depicted in FIG. 4b is when the magnetic sensor assembly is in the calibration mode in order to determine a second calibration value corresponding to the current gain between the second emitter 412 and the second collector 414. In this stage of the calibration mode, the first emitter, the first base control region and the first collector are isolated from the governing circuit using the switches 431, 433, 435. This, as well as restricting/preventing current flow to/from the first emitter 411 and to/from the first collector 413, restricts/prevents from entering or exiting the semiconductor layer via the first base control region 415. Other switches 432, 434, 436 connect the governing circuit to the second emitter, the second collector and the second base control region. In this way the governing circuit is configured to apply a current between the second emitter and the second collector. In this embodiment, the governing circuit is configured to determine a second calibration value corresponding to the second current gain using the ratio of the second collector current and the second emitter current, using a second emitter current ammeter, a second collector current ammeter and a processor (not shown). The second calibration value is stored in a memory.

By disconnecting the base control region for the calibration mode stages, the current gain value may be determined more accurately per side and be more similar to the situation of symmetrical sensor operation.

Due to Kirchhoff's laws, any difference in the collector currents, between left side and right side for instance, will also be reflected as a difference in the base control region currents for right and left measurements. The offset may also be determined through the current(s) to/from the base control region contact(s). For example, the base current could provide a calibration value corresponding to a current gain.

Figure 4C:
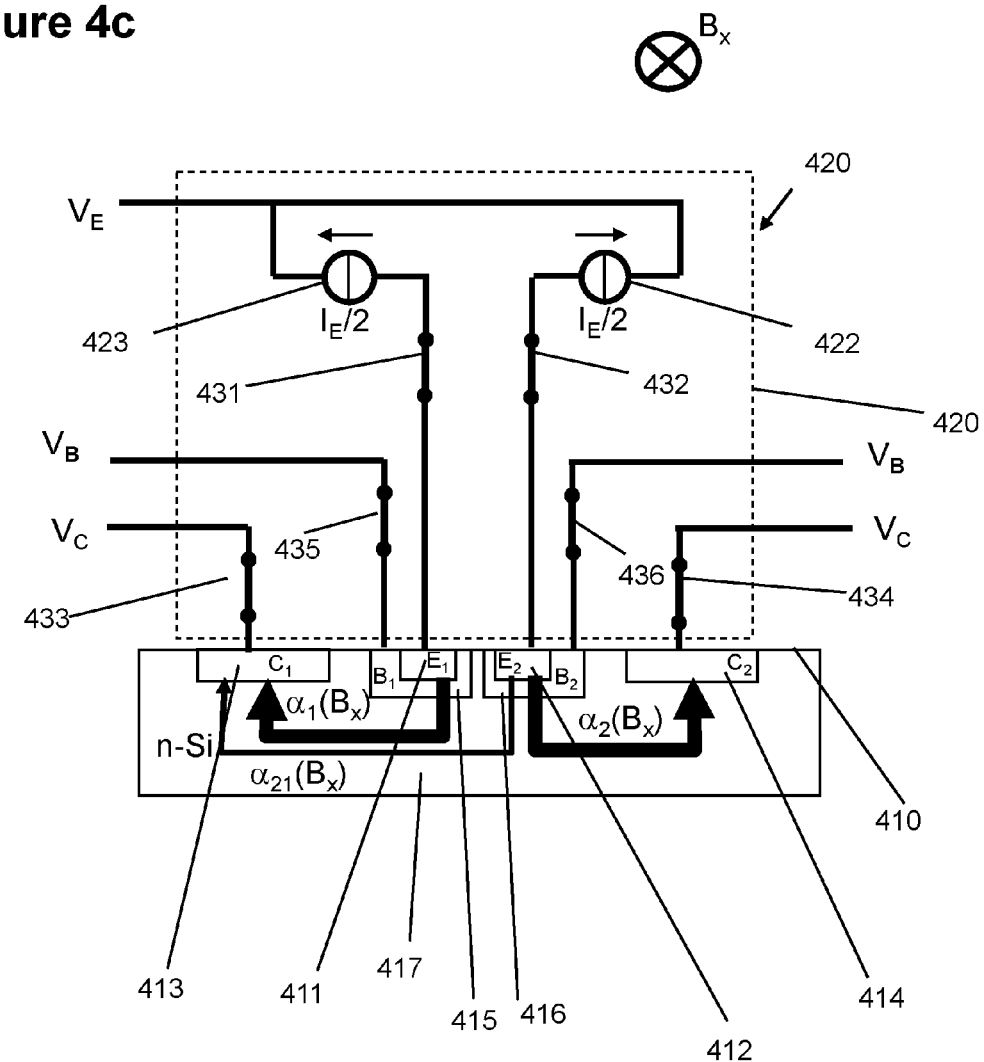
FIG. 4c shows the embodiment of FIG. 4a in a sensor mode.

FIG. 4c depicts the embodiment of FIG. 4a in a sensor mode when the magnetic field is non-zero. In this case, the current received at the first collector 413 includes the current emitted at the first emitter 411 and a crosstalk component emitted at the second emitter 412. The governing circuit 420 is configured to determine first and second sensed current values corresponding to the first and second collector currents using first and second collector current ammeters (not shown). The governing circuit 420 calculates the difference between the sensed current values and subtracts the offset value calculated in the calibration mode to determine the output sensor value. Using the output sensor value, the governing circuit calculates the corresponding magnetic field strength, for example using a conversion formula or a conversion table.

It will be appreciated that there may be embodiments where the first and second emitters can be considered to be contiguous. In such embodiments, a value for the offset may be obtained to at least partially compensate for the actual offset. Advantages of embodiments with contiguous first and second emitters may include that they can be manufactured more easily and cheaply as there are fewer components, and/or that they can be manufactured to be smaller.

Likewise, it will be appreciated that there may be embodiments where the first and second bases can be considered to be contiguous. Advantages of embodiments with contiguous first and second bases may include that they can be manufactured more easily and cheaply as there are fewer components, and/or that they can be manufactured to be smaller.

Figure 5A:
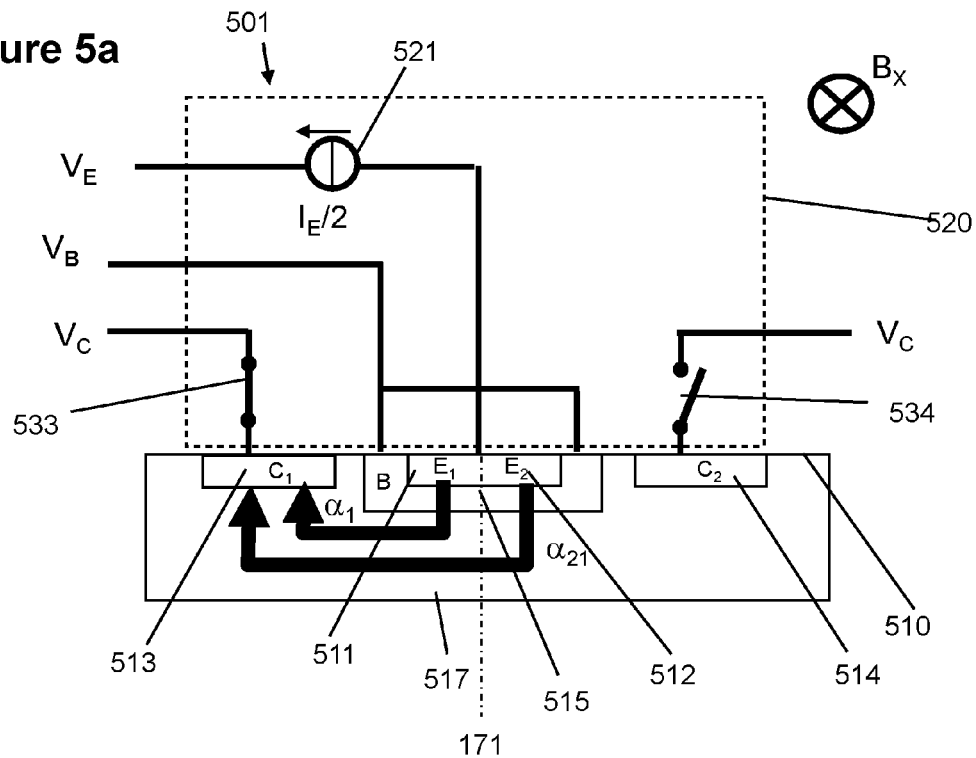
FIG. 5a illustrates a further embodiment in a calibration mode for determining a first calibration value.

FIG. 5a shows a schematic cross-sectional representation of an embodiment of a magnetic sensor assembly 501 comprising a semiconductor layer 517 comprising n-type silicon. The semiconductor layer comprises a first emitter 511 and a second emitter 512, and a first collector 513 and a second collector 514. The collectors and emitters are located on a semiconductor layer surface 510. The first 511 and second emitters 512 can be considered to be contiguous. The first emitter, in this case 511, is the region closest to the first collector and the second emitter, in this case, is the region closest to the second collector. The first emitter 511 and the second emitter 512 are located between the first collector 513 and the second collector 514. This embodiment also comprises a control region 515 which is a base control region. The base control region 515 is, in this case, a p-type region in which the n-type first emitter 511 and the n-type second emitter 512 have been made. This embodiment also comprises a governing circuit 520 configured to control and measure current flow independently between the each of the first and second collectors and the emitters. That is the device can be configured such that current passes from the emitters to the first collector only, and such that current passes from the emitters to the second collector only.

In this embodiment, it is assumed that there is no leakage-current path through the bottom of the structure. For example, the magnetic sensor assembly may employ Silicon-On-Insulator (SOI) type or Complementary metal-oxide-semiconductor (CMOS) technologies. There is a current gain (usually called the common-base, transfer function) from emitter to each collector: $\alpha_1$ for the collector $C_1$ and $\alpha_2$ for the collector $C_2$. As for the embodiment depicted in FIG. 1a and described above, these current gain values may differ, even when $B_x$ is zero, giving rise to an offset. As the first and second emitters are contiguous, in this case, they are connected/disconnected simultaneously to the governing circuit.

This embodiment comprises collector switches 533, 534 which enable current flow to be independently controlled between the first emitter and the first collector, and between the first emitter and the second collector. When the first collector switch 533 is open, current is prevented/restricted from passing between the first emitter 511 and the first collector 513, whereas when the first collector switch 533 is closed, current is enabled to pass between the first emitter 511 and the first collector 513. Correspondingly, when the second collector switch 534 is open, current is prevented/restricted from passing between the second emitter 512 and the second collector 514, whereas when the second collector switch 534 is closed, current is enabled to pass between the second emitter 512 and the second collector 514.

A first stage in the calibration mode is to measure a collector current of the first collector 513, $C_1$, when current to the second collector 514, $C_2$ is restricted or prevented (e.g. by disconnecting or otherwise restricting current flow to the second collector using second collector switch 534). Correspondingly, in a second stage in the calibration mode, the current in second collector $C_2$ is measured when current is restricted or prevented from passing from the first collector $C_1$. The first and second calibration values of collector current corresponding to first and second calibration current gains, obtained in this way are then subtracted electronically by the governing circuit such that they provide a value of the offset. Unlike previous embodiments with separate first and second emitters the first calibration mode current gain, $\alpha'_1$, and second calibration mode current gain comprises cross-talk components:

$$\alpha'_1 = \alpha_1 + \alpha_{21}; \text{ and}$$

$$\alpha'_2 = \alpha_2 + \alpha_{12}.$$

As for previously described components, the calibration works by virtue of the property that a single collector current is not very sensitive to a magnetic field. The deflection still takes place, but, as explained previously there is no current-division effect that may occur. So, in case of an npn-type bipolar transistor, all emitted electrons will travel to $C_1$ (or, in the second stage, $C_2$). Magnetic field strengths of $|B_x|<20$ mT may not affect the single-sided collector currents. In other words, the offset may be determined independently of the present magnetic field, if not too large.

FIG. 5a shows a first step of a calibration mode, where second collector 514, $C_2$ has been disconnected using second collector switch 534. The result is that the first emitter 511 on the same side as the first collector 513, $C_1$ transfers half of the emitter current by a factor $\alpha_1$ and that the second emitter 512 transfers half of the emitter current with a factor $\alpha_{21}$. The first collector current consists of two components corresponding to the currents originating from the two emitters: $I'_{C1}=(\alpha_1+\alpha_{21})I'_E/2$. This implies that $I'_{C1}=\alpha'_1 I'_E$, where $\alpha'_1=(\alpha_1+\alpha_{21})/2$. The prime (') is used for the calibration mode.

Figure 5B:
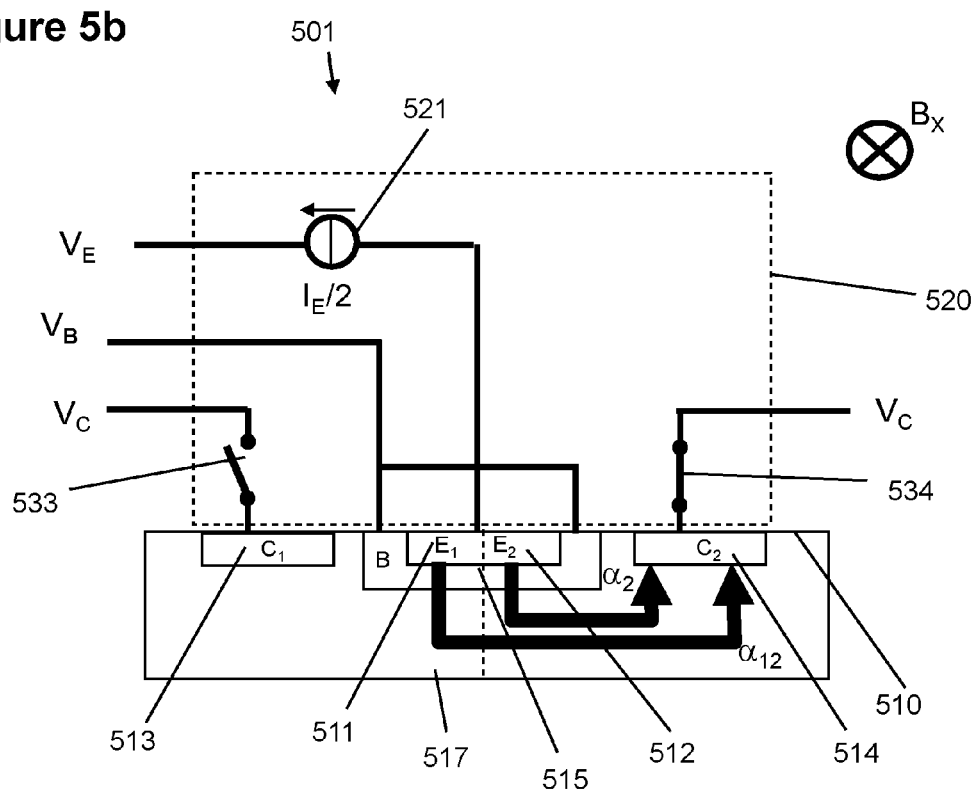
FIG. 5b shows the embodiment of FIG. 5a in a calibration mode for determining a second calibration value.

FIG. 5b shows the complementary situation of the calibration mode, for determining a second calibration value corresponding to the second calibration current gain. In this case the first collector 513 is disconnected by the governing circuit 520 using first collector switch 533. The second collector current consists of two components: $I'_{C2}=(\alpha_2+\alpha_{12})I'_E/2$. This implies that $I'_{C2}=\alpha'_2 I'_E$, where $\alpha'_2=(\alpha_2+\alpha_{21})/2$.

In a general sense, the technique described in FIGS. 5a and 5b can also be applied to embodiments with spatially separate first and second emitters, wherein: in a first calibration mode stage, current is passed from the first and second emitters to a first collector and current is restricted/prevented from passing through the second collector; and, in a second calibration mode stage, current is passed from the first and second emitters to a second collector and current is restricted/prevented from passing through the first collector.

The following is an example of a set of measurements for an SOI-type CMOS-based embodiment of FIG. 5a in a sensor mode. In the balanced, sensor mode of operation shown in FIG. 5c, the measured gains were found to be:

$$\alpha_1=0.94055 \text{ and } \alpha_2=0.96945.$$

These values were extracted from the total collector current ($I_{C1}+I_{C2}$=1.91 mA) and the offset ($I_{C1}-I_{C2}$=−28.9 μA) at given $I_E$=2 mA. In the first step, in FIG. 5a, it was found that $α'_1$=0.904 for $I'_E$=1 mA. In the second step, in FIG. 5b, it was found that $α'_2$=0.910 for $I'_E$=1 mA. For these measurements the emitter current during first and second steps of the offset-measurement mode was set to half of the value during the sensor mode of operation: $I'_E=I_E/2$. Because the current gain may be bias-current dependent, the preferred emitter-current setting is such that the sum of collector currents in the offset-measurement mode is as close as possible to the sum of collector currents during the sensor mode of operation. The latter is:

$$I_{C1}+I_{C2}=(α_1+α_2)I_E/2=(0.94055+0.96945)·2 \text{ mA}/2=1.91 \text{ mA}.$$

And for the calibration mode of operation it was found that:

$$I'_{C1}+I'_{C2}=(α'_1+α'_2)I'_E=(0.904+0.910)·1 \text{ mA}=1.814 \text{ mA}.$$

So there appears to be a difference. The calibration mode method yields for a difference in offset:

$$I'_{C1}-I'_{C2}=(α'_1-α'_2)I'_E=(0.904-0.910)·1 \text{ mA}=-6 \text{ μA},$$

whereas the normal sensor mode of operation yields:

$$I_{C1}-I_{C2}=-28.9 \text{ μA}.$$

That is, where the first and second emitters are contiguous, although the offset calculated using the calibration mode method would not fully compensate for the offset when in a sensor mode, the determined offset may be used to improve the accuracy of the readings in the sensor mode.

A value of $α_{21}$=0.86745 (corresponding to the 'cross-talk' component from the second emitter to the first collector) was calculated from $α'_1=(α_1+α_{21})/2$ and the known values of $α'_1$ and $α_1$. Likewise, from $α'_2=(α_2+α_{12})/2$ with the known values for $α'_2$ and $α_2$, a value of $α_{12}$=0.85055 was calculated (the 'cross-talk' component from the first emitter to the second collector). These values suggest that the emitter is not emitting evenly (uniformly) distributed over its length. In this case the second emitter is injecting at a somewhat more elevated level. This is known from literature in studies of the causes of magneto-transistor offset (Metz et al. Proc. Transducers '99, 1999, 88-91).

Figure 6:
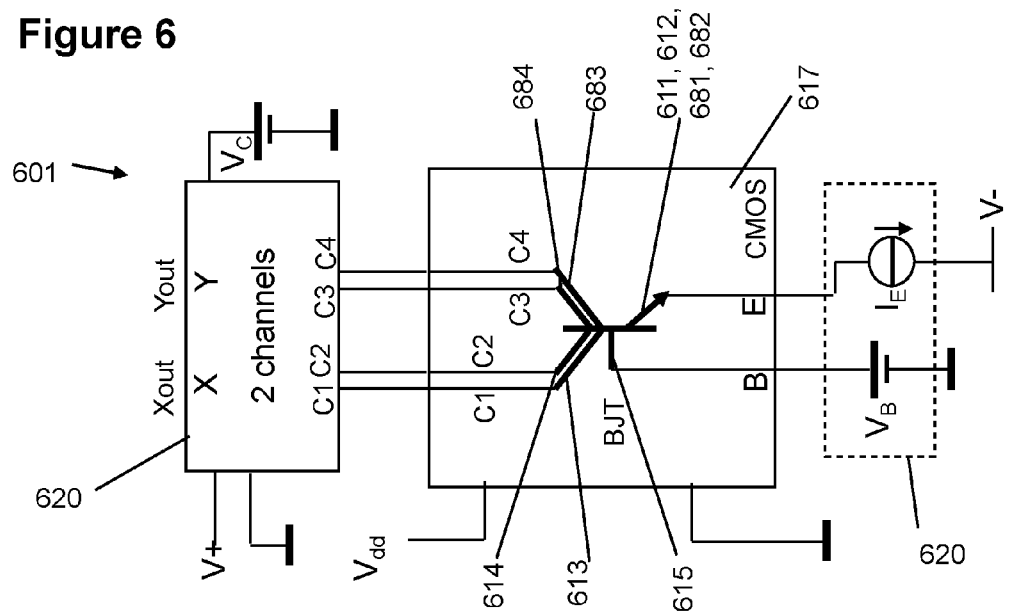
FIG. 6 shows a further embodiment configured to sense a magnetic field along two axes.

FIG. 6 shows a schematic of a further embodiment 601 of a magnetic sensor assembly, which facilitates providing the biasing and read-out of a four- or two-output-terminal semiconductor layers in an electronic circuit. The magnetic sensor assembly comprises: a semiconductor layer comprising a first collector 613, a second collector 614, a third collector 683 and a fourth collector 684, and a first emitter 611, a second emitter 612, a third emitter 681 and a fourth emitter 682. The emitters 611, 612, 681, 682 are located between the first, second, third and fourth collectors 613, 614, 683, 684. The collectors are arranged in two pairs. The first and second collectors 613, 614 are arranged along a first collector axis, such that they probe the magnetic field in a first magnetic field axis (the output of which in this case is the X-channel). The third and fourth collectors 683, 684 are arranged along a second collector axis, such that they probe the magnetic field in a second magnetic field axis (the output of which in this case is the Y-channel). The first and second collector axes may be perpendicular to each other. In this case, the first, second, third and fourth emitters 611, 612, 681, 682 are contiguous with each other. It will be appreciated that for other embodiments, each emitter may be spatially separate. This embodiment also comprises a governing circuit 620 configured to control and measure current flow independently between the first collector and first emitter, and between the second collector and second emitter.

The base 615 terminal is, in this case, connected to a bias voltage $V_B$ of the governing circuit and the emitters to a current source $I_E$ of the governing circuit. The maximum available current per sensor axis (or per collector pair) is, in this case, equal to $I_E/2$. The first and second collectors of the X-channel ($C_1$ and $C_2$) and the third and fourth collectors of the Y-channel ($C_3$ and $C_4$) are biased by a voltage source $V_C$. The X- and Y-channels of the governing circuit 620 convert the differential collector currents into signals (e.g. voltage signals) at their respective outputs $X_{out}$ and $Y_{out}$. In order to determine corresponding values for the magnetic field, $B_x$, $B_y$, the governing circuit uses a calibration equation which relates the magnetic field strength to the output sensor value.

It will be appreciated that the magnetic sensor assembly may facilitate measurement of the magnetic field components in three dimensions.

Figure 7:
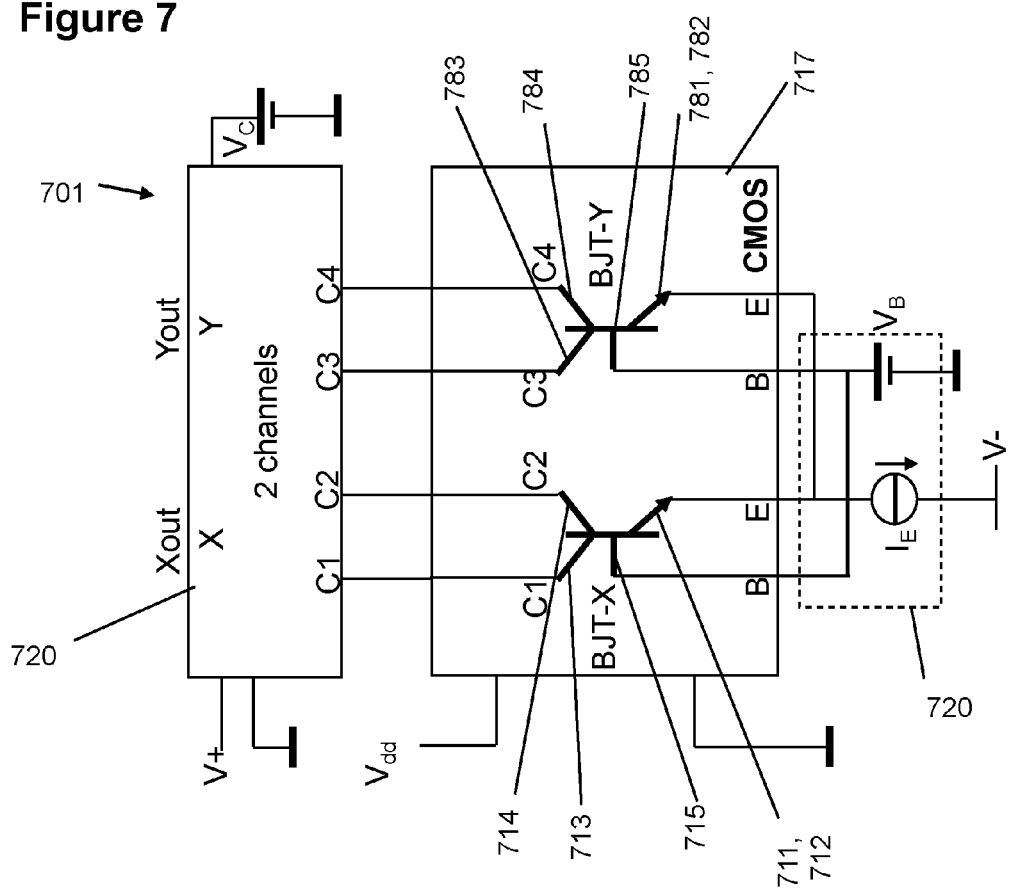
FIG. 7 depicts a further embodiment configured to sense a magnetic field along two axes.

FIG. 7 depicts an embodiment of a magnetic sensor assembly 701 comprising a semiconductor layer region 717 and a governing circuit 720. As for the previous embodiment, this embodiment is configured to have two channels for determining the magnetic field strength, for example along two different axes. The semiconductor layer in this case comprises a first collector 713, a second collector 714, a third collector 783 and a fourth collector 784, and a first emitter 711, a second emitter 712, a third emitter 781 and a fourth emitter 782. The collectors are arranged in two pairs. The first and second collectors 713, 714 are arranged along a first collector axis, such that they probe the magnetic field in a first magnetic field axis (the output of which in this case is the X-channel). The third and fourth collectors 783, 784 are arranged along a second collector axis, such that they probe the magnetic field in a second magnetic field axis (the output of which in this case is the Y-channel). The first and second collector axes may be perpendicular to each other. Unlike the previous embodiment, the first, second, third and fourth emitters are not all contiguous. In this embodiment the first and second emitters 711, 712 are contiguous and the third and fourth emitters 781, 782 are contiguous, but the first and second emitters 711, 712 are separate from the third and fourth emitters 781, 782. The first and second emitters 711, 712 are located between the first and second collectors 713, 714, whereas the third and fourth emitters 781, 782 are located between the third and fourth collectors 783, 784. It will be appreciated that the two sets of emitters and collectors may be located on separate dies. It will be appreciated that for other embodiments, each emitter may be spatially separate. This embodiment also comprises a governing circuit 720 configured to control and measure current flow independently between the first collector and first emitter, and between the second collector and second emitter.

For this embodiment, the base control regions 715, 785 and emitters 711, 712, 781, 782 of the first and second semiconductor layers are tied together such that the emitter currents are identical at identical base-emitter voltage $V_{BE}$ for both sensors. The maximum available current per sensor axis (or per collector pair) is equal to $I_E/2$.

It will be appreciated that the methods described in this disclosure could be applied to other types of semiconductor device.

Figure 8:
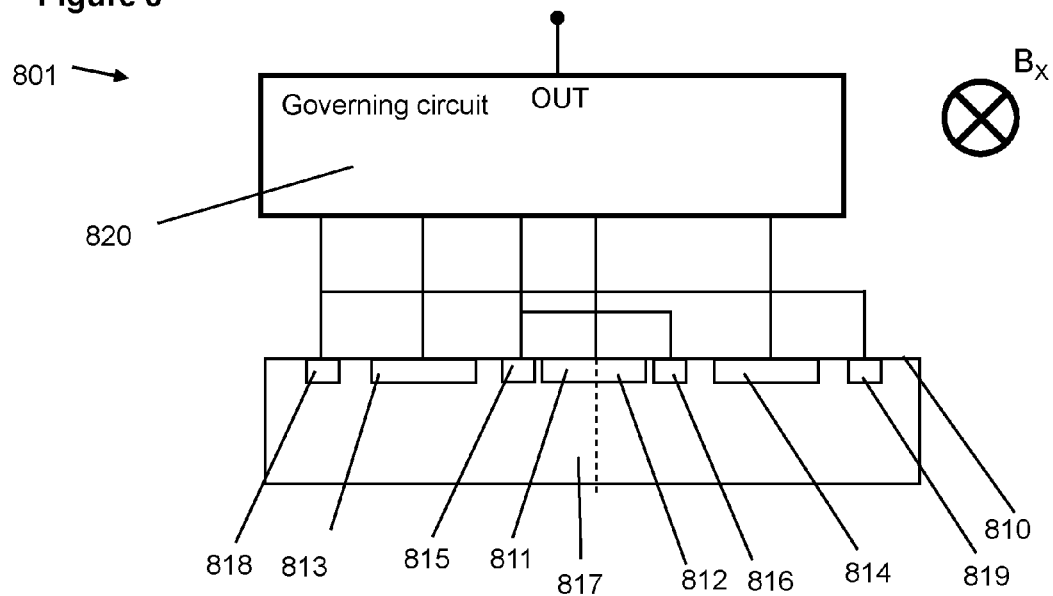
FIG. 8 shows a further embodiment of a magnetic sensor assembly.

For example, FIG. 8 depicts a cross-section of a semiconductor layer 817 and governing circuit 820, of an embodiment 801, which is a lateral bipolar magneto-transistor. The semiconductor layer 817 may be undoped silicon or lightly doped silicon. The semiconductor layer 817 has first and second contiguous emitter regions 811, 812 and first and second collectors, 813, 814. The collectors and emitters are n+ type silicon in a p-type silicon substrate, which can be a highly doped region with doping concentrations above $10^{18}$ cm$^{-3}$. The term "highly doped" may be similar to the term "degenerately doped", which can mean that the material exhibits pseudo-metallic behaviour. There are two control region guards 815, 816 of p-type silicon located between the first/second emitter and the respective first/second collector so as to prevent side injection directly to the collectors. The two control region guards 815, 816 can comprise highly doped p-type silicon. It will be appreciated that for other embodiments these control region guards may not be present. There are also two p+ base connections (there is only one base region) 818, 819. The carrier trajectories of the lateral bipolar magneto-transistor are mainly in a direction parallel to the surface. Shallow trench isolation may be used to separate the various structures illustrated in FIG. 8.

According to some embodiments, when the semiconductor layer is connected to the governing circuit 820 and the magnetic sensor assembly is in sensor mode, the emitter-base junction in forward biased and the collector-base junction in reverse biased mode. The injected electrons supplied by the governing circuit are then divided over the two collectors. As for previous embodiments, in a sensor mode when both collectors are connected to the governing circuit, differences in gain may result in differing current values at each of the first and second collectors 813, 814 in the absence of a magnetic field. This gives rise to an offset.

In a sensor mode, when a magnetic induction $B_x$ is applied in the indicated direction, the first collector, $C_1$, will be carrying a slightly larger current than the second collector $C_2$. This is caused by the Lorentz force acting on the carriers, which are minority carriers in this semiconductor layer.

The offset can be determined by using a calibration mode wherein current is passed from the first and second emitters to the first collector, whilst restricting or preventing current from passing from the second collector, thereby determining a first calibration value corresponding to a first calibration current gain. Then to determine a second calibration value corresponding to a second calibration current gain, a current is applied between the first and second emitters and the second collector. Determining the difference between the first calibration value and the second calibration value, gives an offset value which can be used in a sensor mode to compensate for the offset.

It will be appreciated that other embodiments may use separate emitters. It will be appreciated that other embodiments may use separate bases, each base connected by a separate wire to the governing circuit. It will be appreciated that for other embodiments the control region guards and may be each be connected to the governing circuit 820 by a separate wire. It will be appreciated that for some embodiments the control region guards may not be present.

Figure 9:
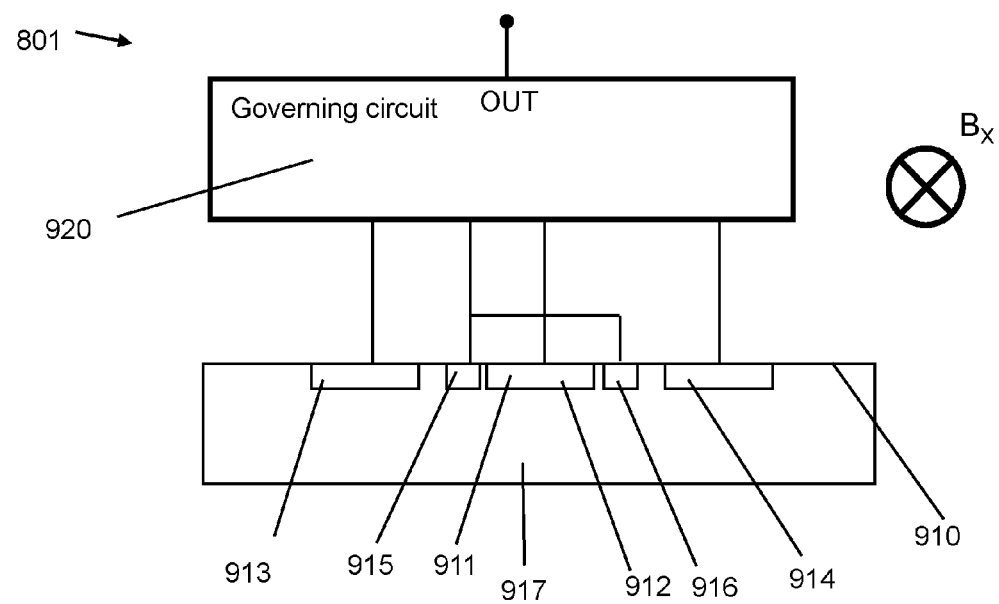
FIG. 9 shows a further embodiment of a magnetic sensor assembly.

FIG. 9 depicts a cross-section of a semiconductor layer 917 and governing circuit 920, of an embodiment 901. Unlike the semiconductor layer of FIG. 5a, it is not a transistor. It has first and second contiguous emitter regions 911, 912 and first and second collectors, 913, 914. The control regions 915, 916 are guards which are p-type, and the collectors and emitters are all n-type. The control region guards 915, 916 are located between the first/second emitter and the respective first/second collector.

When the semiconductor layer is connected to the governing circuit 920 in a sensor mode, and in the absence of a magnetic field, the injected electrons supplied by the governing circuit are then divided over the two collectors. As for previous embodiments, in a sensor mode when both collectors are connected to the governing circuit and in the absence of a magnetic field, differences in gain (where gain is the transfer from input-terminal current to output terminal current) may result in differing current values at each of the first and second collectors 913, 914, thereby giving rise to an offset. This embodiment may be considered to act as a resistive current divider.

Similar to the semiconductor layer of FIG. 5a, current supplied to the first and second contiguous emitter regions can be split over two collectors, influenced by an induction $B_x$. It will be appreciated that a corresponding semiconductor later may have spatially separate emitter regions. In this device the carriers which are deflected by the Lorentz force, are majority carriers, which in this case are electrons.

The offset can be determined, in this case, by using a calibration mode wherein current is passed from the first and second emitters to the first collector, whilst restricting or preventing current from passing to the second collector, thereby determining a first calibration value corresponding to a first calibration current gain. Then, to determine a second calibration value corresponding to a second calibration current gain, a current is applied between the first and second emitters and the second collector. Determining the difference between the first calibration value and the second calibration value, gives an offset value which can be used in a sensor mode to compensate for the offset.

Magneto-transistors may need to be calibrated to compensate for offset between the collector currents in the absence of an applied magnetic field. Such calibration during the fabrication process increases the costs of production of such devices. As previously discussed, prior art bipolar magneto-transistors often show large offsets in the absence of a magnetic field. For many prior art devices, the offset must be calibrated during fabrication. However, the offset can drift during use and may be a function of environmental conditions. It may therefore be advantageous to be able to recalibrate the device for changed offset during use.

Embodiments of the invention previously described may account for offset between the collector currents in the absence of an applied magnetic field by independently measuring collector current signals. An alternative way to account for an offset after fabrication of the device is to measure a first and second collector current of a magneto-transistor at a medium or lower injection level in a calibration mode, where the bipolar transistor is relatively insensitive to magnetic fields.

Medium and high injection levels may be referred to herein as lower and higher injection levels, respectively. Medium and high injection levels can be described and distinguished from each other by comparing the concentration of the minority charge carriers injected from the emitter into the base region of a magneto-transistor with the doping concentration in the base region. For example, in npn bipolar transistors with a p-doped base region, if the amount of injected electron concentration (which are minority carriers in the base) is smaller than the p-doping concentration in the base may be said to be operating at a medium injection level. Medium injection may be achieved when operating a magneto-transistor with a base-emitter voltage of 0.4 between 0.7 V. For an npn transistor, when a base-emitter voltage is applied that injects more electrons than p-dopant into in the base, the transistor may be said to be operating at high injection level. Bipolar transistors are usually operated not at high injection levels. The base-emitter voltage where the high injection regime starts depends also on the specific transistor design, for instance the doping concentration in the base.

Figure 5C:
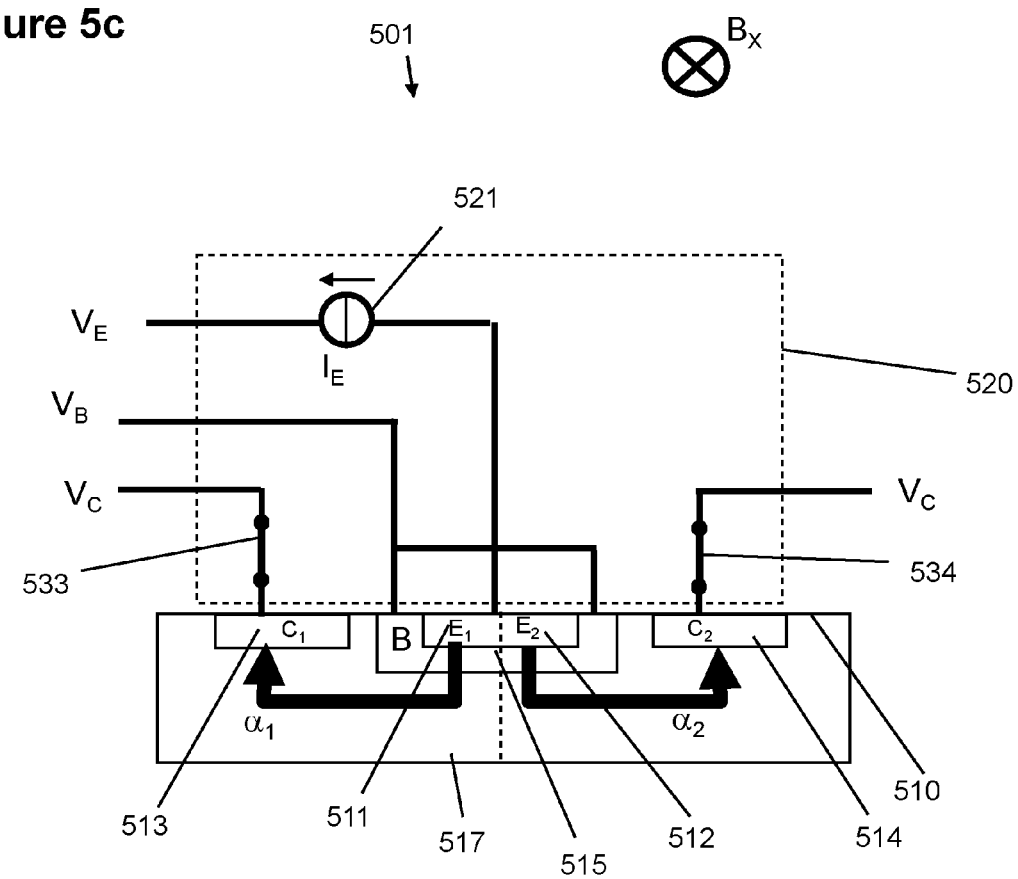
FIG. 5c depicts the embodiment of FIG. 5a in a sensor mode.

The alternative correction method may be used in conjunction with any of the (lateral) magneto-transistor of FIG. 8, the contiguous double emitter vertical magneto-transistor 501 as illustrated in FIG. 5c or the separate double emitter vertical magneto-transistor as illustrated in FIG. 4c, 1e or 1f without any requirement to modify the magneto-transistors shown in these figures.

Although the offset current varies with the injection level at which the transistor is operating, another metric, referred to as a relative offset, is largely insensitive to the change in injection level. The relative offset can be taken to be:

$$\Delta I_{rel\_off} = [I_{c1} - I_{c2}]/[I_{c1} + I_{c2}].$$

$I_{c1}$ and $I_{c2}$ are the collector currents of the respective collectors.

The relative offset current measured in the calibration mode may therefore be used to compensate for the relative offset at a higher injection level in a sensor mode, where the magneto-sensitivity is greater or at a maximum value.

An important requirement for such a method is that the relative offset, which may also be referred to as the "mismatch", is independent of the mechanism used to change the injection level, or that the relative offset at the higher injection level can be calculated from the relative offset at the lower injection level. The basic principle applied in magneto-transistors is to steer charge carriers more towards one output terminal (first collector) than towards a second output terminal depending on an applied magnetic field. This steering happens because of the action of the Lorentz force on charge carriers within the transistor. This steering is also known as charge "filtering", or charge "separation". Where this filtering actually takes place in the magneto-transistor depends on its design.

In the vertical magneto-transistors (VMT) described herein, filtering may be performed in both the base region as well as the base-collector space charge region (in these designs filtering also occurs in the emitter-base junction region), rather than predominantly in the base-collector space charge region. The magneto-sensitivity of the VMTs described herein is sensitive to the base-emitter voltage because filtering is performed in the base-emitter region.

Lateral magneto-transistors (LMT) may not perform filtering in the base-collector region. Rather, filtering in LMTs may occur in the base and emitter-base junction regions. Therefore, the magneto-sensitivity for these LMT designs is more dependent on the emitter-base voltage than on the collector or substrate voltage for such designs. In fact, changing the collector-base or the collector-substrate voltage does not result in a significant change in magneto-sensitivity in such devices.

Devices that perform filtering in the base region have the advantage that the mobility in the base can be higher because of the lower doping concentration. By increasing the base-emitter voltage, the base current can be changed from diffusion current in a calibration mode (at the lower base-emitter voltage, lower injection) to drift current in a sensor mode (at the higher base-emitter voltage, higher injection). Because the effect of the Lorentz force on the charge carriers is much smaller in the case of diffusion currents, the magneto-sensitivity can be "switched-on" by going from a diffusion current regime to a drift current regime.

Figure 10:
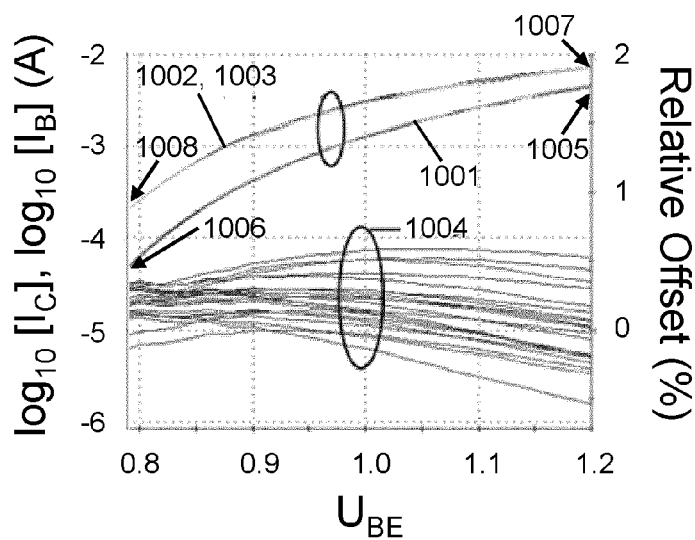
FIG. 10 shows a plot of base and collector currents against base-emitter voltage for a vertical magneto-transistor together with the relative collector current offset against base-emitter voltage.

In mismatch measurements of the bipolar magneto-transistors described herein with reference to FIG. 10, it can be seen that the relative offset does not depend strongly on the emitter-base voltage. However, the magneto-sensitivity of the transistor does depend on the emitter-base voltage. A reason for this dependence is that a large drift current in the base region is required for a high magneto-sensitivity. This results in a low or zero magneto-sensitivity for low and medium injection levels and in a high magneto-sensitivity for high injection levels. In some embodiments of the present invention, the magneto-sensitivity can be increased by changing the base-emitter voltage from a lower injection regime in a calibration mode to a higher injection regime in a sensor mode.

Devices that rely on filtering in the base-collector space charge region may change a base-collector voltage or a substrate-base voltage in order to alter the electric field in the region. Changing the base-collector voltage also changes the mobility of the charge carriers; the higher the electric field, the lower the carrier mobility. As filtering depends on the (Hall) mobility of the charge carriers, the sensitivity is a function of the collector-base voltage for such devices. Such devices are typically operated at a medium injection level when measuring the applied magnetic field. For devices that filter in the base-collector region, the sign of the sensitivity change as a function of the base-collector voltage is the opposite of that caused by varying the base-emitter voltage of a transistor configured to filter in the base-emitter region.

FIG. 10 illustrates the variation of base (1001) and collector currents (1002, 1003) of a vertical magneto-transistor, such as those referred to in FIG. 1, against base-emitter voltage, $U_{BE}$. The values for the base and collector currents 1001, 1002, 1003 is shown on the left hand axis of FIG. 10 on a logarithmic scale. $U_{BE}$ is shown on the horizontal axis. Such a representation is known as a Gummel plot. The base current curve 1001 of the transistor decays exponentially from around 5 mA at $U_{BE}$(1.2 V), shown at a first point 1005, to 0.05 mA at $U_{BE}$(0.8 V), shown at a second point 1006. The two collector currents ($I_{C1}$, $I_{C2}$) of the magneto-transistor are represented by the curve 1002, 1003 at the top of the figure and are indistinguishable on the scale shown. The collector current curves 1002, 1003 of the transistor decay exponentially from around 8 mA at $U_{BE}$(1.2 V), shown at a third point 1007, to 0.2 mA at $U_{BE}$(0.8 V), shown at a fourth point 1008.

The variation of the relative offset against base-emitter voltage $U_{BE}$ is also shown using a linear scale on the right hand axis of FIG. 10. Each of the plurality of curves 1004 at the lower extent of FIG. 10 represents a relative offset measurement of several samples of the same design on the same wafer but on different locations on the wafer. The spread shown in this figure is therefore representative of on-wafer spread, rather than experimental spread for an individual transistor. The origin of the on-wafer spread depends on the design of the magneto-transistor.

In FIG. 10 the relative offset can be seen to be broadly insensitive to variation in the base-emitter potential between 0.8 and 1.2 V, in which the plurality of curves 1004 are generally flat. This relationship is also the case at lower base-emitter potentials, which are not shown in FIG. 10.

Figure 11:
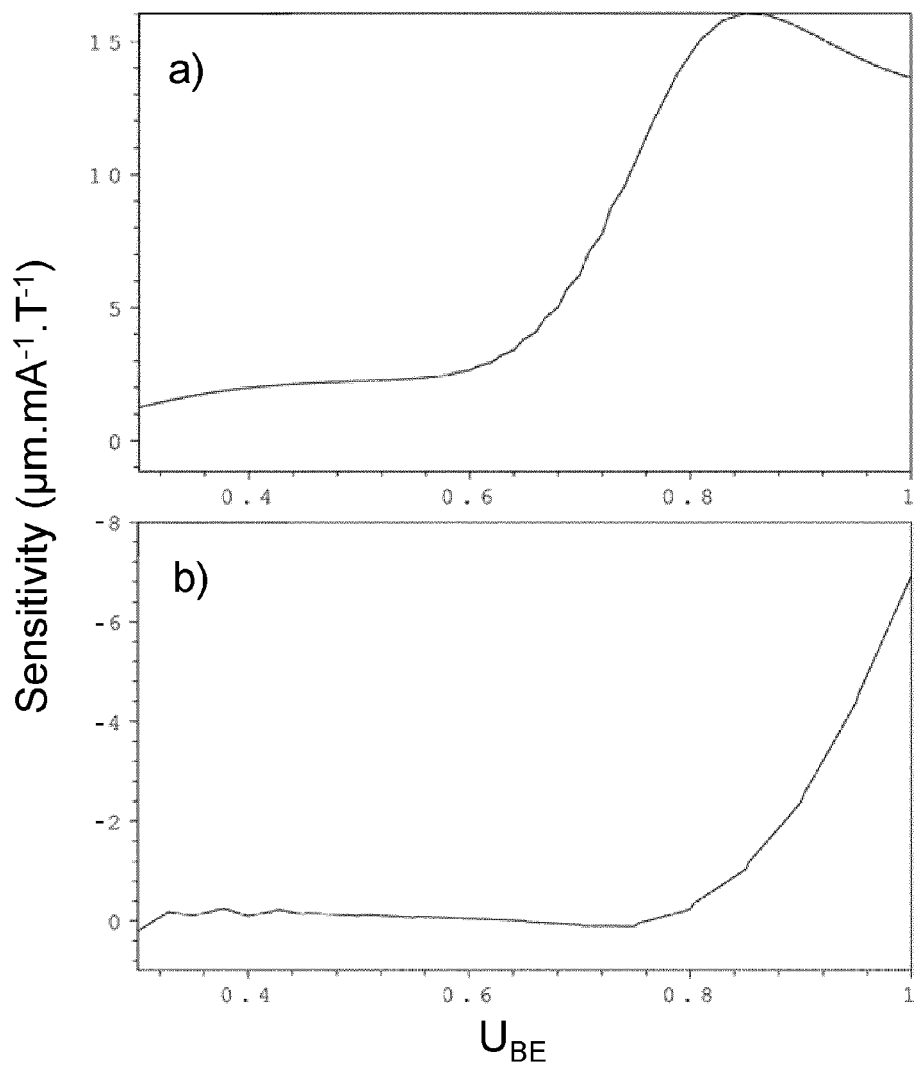
FIG. 11a shows a plot of the magneto-sensitivity against base-emitter voltage of a vertical magneto-transistor.
FIG. 11b shows a plot of the magneto-sensitivity against base-emitter voltage of a lateral magneto-transistor.

FIG. 11 illustrates the variation in magneto-sensitivity against base-emitter voltage for two different designs of magneto-transistor.

The curve presented as FIG. 11a corresponds to a sensitivity profile of a vertical magneto-transistor, the same type as that described with reference to FIG. 10. It can be seen that a maximum value of the magneto-sensitivity is achieved in this example when operating with a base-emitter voltage of about 0.85-0.9 V. There is a steep decay in magneto-sensitivity when the base-emitter voltage is reduced to around 0.6 V. In fact, as a function of voltage, the sensitivity at 0.8 V is approximately a factor of 5 greater than the sensitivity at 0.6 V, in the example shown in FIG. 11a. Therefore, a base-emitter voltage of 0.8 V may be suitable for use in a sensor mode and 0.6 V may be a suitable base-emitter voltage for use in a calibration mode for this transistor. It can also be seen that there is a slow decay in sensitivity when the base-emitter voltage is decreased below 0.6 V. The sensitivity of the magneto-transistor also reduces when operating at a base-emitter potential higher than about 0.9 V (the voltage at which the maximum sensitivity is achieved).

FIG. 11b illustrates a sensitivity profile of a lateral magneto-transistor. The magneto-sensitivity of the lateral magneto-transistor is negative. The highest measured sensitivity of this design is achieved at a base-emitter voltage of 1 V (which is the highest potential applied to this specimen). There is a steep drop-off in sensitivity to around 0 $\mu m \cdot mA^{-1} \cdot T^{-1}$ as the base-emitter voltage is reduced to about 0.8 V. The sensitivity is relatively constant at around 0 $\mu m \cdot mA^{-1} \cdot T^{-1}$ when the base-emitter potential is further reduced below 0.8 V. As the sensitivity drops-off to zero within a practical voltage range, a very high ratio of sensitivity may be achieved between the sensitivity at a measurement voltage, $S(U_{mes})$ in a sensor mode, and a sensitivity at a calibration voltage, $S(U_{cal})$, in a calibration mode. In this example, an appropriate $U_{mes}$ may be 1 V and an appropriate $U_{cal}$ may be 0.8 V. However, the practicality of the lateral magneto-transistor that provided the data of FIG. 11b is limited by its relatively low maximum sensitivity (with a modulus of about 7 $\mu m \cdot mA^{-1} \cdot T^{-1}$ in the range shown) compared with the maximum sensitivity of the vertical magneto-transistor illustrated in FIG. 11a (about 16 $\mu m \cdot mA^{-1} \cdot T^{-1}$).

From the results shown in FIGS. 10 and 11, it can be understood that the base-emitter voltage can be used to control the magneto-sensitivity of magneto-transistors and that, as the relative offset is largely insensitive to variation in base-emitter voltage, a calibration reading may be taken at low magneto-sensitivity in a calibration mode and used to compensate for the offset of a measurement taken in a sensor mode at a higher magneto-sensitivity. Therefore, the magneto-transistor can be calibrated in the presence of an applied magnetic field.

As the collector currents drop off exponentially with the lowering of the base-emitter voltage, it is of practical interest to maximise the base-emitter voltage at which a calibration measurement is taken in the calibration mode in order to increase the signal to noise ratio of the collector current measurements. This is because measuring low intensity currents (for example, in the microamp range) can result in an increased signal to noise ratio. In addition, poor selection of collector currents may result in difficulties in implementing application-specific integrated circuit designs.

A governing circuit according to an embodiment of the invention may be provided that makes use of the principles discussed above in relation to FIGS. 10 and 11 in order to correct for an offset current in the presence of an external magnetic field. Such a governing circuit can operate using the method steps illustrated in FIG. 12.

Steps 1201 and 1203 of FIG. 12 illustrate the steps taken during a calibration mode of operation. Steps 1205 and 1207 illustrate the steps taken during a sensor mode of operation. Step 1209 illustrates a determination of a signal related to an applied magnetic field.

At step 1201, the base-emitter voltage, $U_{BE}$, is set to a calibration voltage, $U_{cal}$, corresponding to a magneto-sensitivity. This calibration sensitivity may be a factor lower than the maximum sensitivity. This factor may be 3, 4, 5, 10, 20 or greater than 100, for example. Alternatively, the calibration voltage can be chosen by reference to an absolute value. A calibration voltage in the range of 0.5-0.7 V may be suitable for a silicon magneto-transistor in the calibration mode. The value of the base-emitter voltage in calibration mode can be selected so as to satisfy a compromise between the reduction in magneto-sensitivity and accuracy of measurement of the collector currents.

At step 1203, collector currents of the magneto-transistor, $I_{C1}(U_{cal})$ and $I_{C2}(U_{cal})$, are measured. $I_{C1}(U_{cal})$ and $I_{C2}(U_{cal})$ are also referred to as first and second calibration currents. At the calibration voltage the magneto-sensitivity of the magneto-transistor is low or negligible but a relative offset is present between $I_{C1}(U_{cal})$ and $I_{C2}(U_{cal})$. The relative offset can be determined from the collector current values. This determination can be carried out either at step 1203 or later in the process. The relative offset, $\Delta I_{rel\_off}$, may be calculated as the difference between the collector current values divided by the sum of the collector current, that is, $$\Delta I_{rel\_off}(U_{cal}) = [I_{c1}(U_{cal}) - I_{c2}(U_{cal})]/[I_{c1}(U_{cal}) + I_{c2}(U_{cal})].$$

Steps 1205 and 1207 of FIG. 12 illustrate the steps taken during a sensor mode of operation. At step 1205, the base-emitter voltage is set to a different, measurement voltage, $U_{mes}$. The measurement voltage, $U_{mes}$, is typically higher than the calibration voltage, $U_{cal}$, and can be chosen to correspond to the potential at which the magneto-sensitivity is at a maximum or is considered sufficiently high. The measurement voltage can be chosen by reference to an absolute value. A measurement voltage in the range of 0.7-1.0 V may be suitable for a silicon magneto-transistor operating in the sensor mode.

At step 1207, collector currents of the magneto-transistor, $I_{C1}(U_{mes})$ and $I_{C2}(U_{mes})$, are again measured. An uncorrected output current difference, $\Delta I_{uncorr}$, can be calculated from these measurements. The uncorrected output current comprises components due to the applied magnetic field and the unwanted offset signal. The uncorrected output current, $\Delta I_{uncorr}$, can simply be the difference between the two collector current signals, $I_{C1}(U_{mes})$ and $I_{C2}(U_{mes})$. That is, $$\Delta I_{uncorr} = I_{c1}(U_{mes}) - I_{c2}(U_{mes}).$$

Although the absolute offset (collector current difference without an applied magnetic field) increases roughly exponentially with base-emitter voltage, the relative offset may remain substantially constant for different base-emitter voltages, as illustrated in FIG. 10 (right-hand side vertical axis). Embodiments of the present invention may be used for magneto-transistors where the relative offset does not change or only slightly changes with base-emitter voltage.

If the relative offset does vary substantially with base-emitter voltage for a particular type of transistor, embodiments of the invention can be still of value if the change of the relative offset is substantially smaller than the change in the absolute value of the relative offset.

At step 1209, a corrected output signal indicative of the applied magnetic field is determined. The corrected output signal at least partially accounts for the relative offset present in the uncorrected output signal. The corrected output signal is a function of the first measurement current $I_{C1}(U_{mes})$, second measurement current $I_{C2}(U_{mes})$, first calibration current $I_{C1}(U_{cal})$ and second calibration current $I_{C2}(U_{cal})$. Other factors, such as the sensitivity (S) may also be used to determine the corrected output signal. If the sensitivity of the device is known, which may be determined for example during factory calibration, an estimate of the absolute magnetic field strength may be determined. If the sensitivity of the device is not known the magnetic field may only be given as a relative magnetic field, which might be sufficient for some applications. It may not be necessary to know the sensitivity of the device in order to determine the corrected output signal.

The devices described herein may provide a linear response between output current and applied magnetic field. In this case the change is linear but there are also magnetic field sensors which have non-linear output characteristics. The sensitivity may also be normalized to the emitter current as the collector current difference increases (up to some point) with the emitter current.

For example, the corrected output, $\Delta I_{out}$, signal indicative of the applied magnetic field can be determined using the formula:

$$\Delta I_{out} = \Delta I_{uncorr} - \Delta I_{rel\_off} * [I_{c1}(U_{mes}) + I_{c2}(U_{mes})].$$

In many magneto-transistors, the relative offset can change very slowly over time. Therefore, repeated calibration measurements can be taken to improve operation of the device. However, these calibration step 1201, 1203 do not have to be taken for every measurement cycle 1201-1209. If magnetic field measurements are taken sporadically or if there are moments known when the magnetic field does not have to be measured (for example, during initialization of the device), the measurement time can be increased to be able to measure more accurately the small absolute collector current difference.

The method illustrated in FIG. 12 may be performed on a variety of types of transistor. For example, a governing circuit that performs the functions described in FIG. 12 can be implemented as the governing circuit 820 illustrated in connection with the lateral magneto-transistor of FIG. 8 without altering the connections shown in FIG. 8. Alternatively, a similar governing circuit 120, 420, 520 can be provided to control the contiguous double emitter vertical magneto-transistor as illustrated in FIG. 5c or the separate double emitter vertical magneto-transistor as illustrated in FIG. 4e, 1e or 1f without modification to the magneto-transistor illustrated in these figures.

FIG. 13 provides a series of illustrative examples of the effect of offset compensation and variation of offset with base-emitter voltage.

Figure 13A:
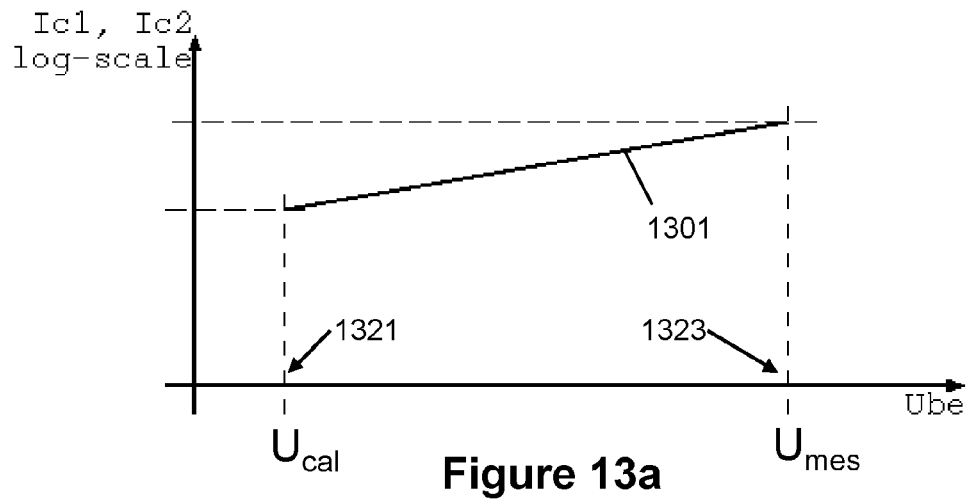
FIG. 13a shows first and second collector currents as a function of the base-emitter voltage on a semi-log scale.

In FIG. 13a, the currents of the first and second collectors, $I_{c1}(U_{BE})$ and $I_{c2}(U_{BE})$, are schematically illustrated as a function of the base-emitter voltage. Note that the curve 1301 in FIG. 13a is plotted on a semi-logarithmic scale; the vertical axis is logarithmic. The absolute collector currents are substantially the same for the two collectors and so are illustrated as a single curve 1301 that increases exponentially with base-emitter voltage. The calibration voltage 1321, $U_{cal}$, provides a lower, or medium, injection level where the magneto-sensitivity is much smaller than the maximum sensitivity. The measurement voltage 1323, $U_{mes}$, is at a higher injection level where magneto-sensitivity is at a maximum or sufficiently high value.

Figure 13B:
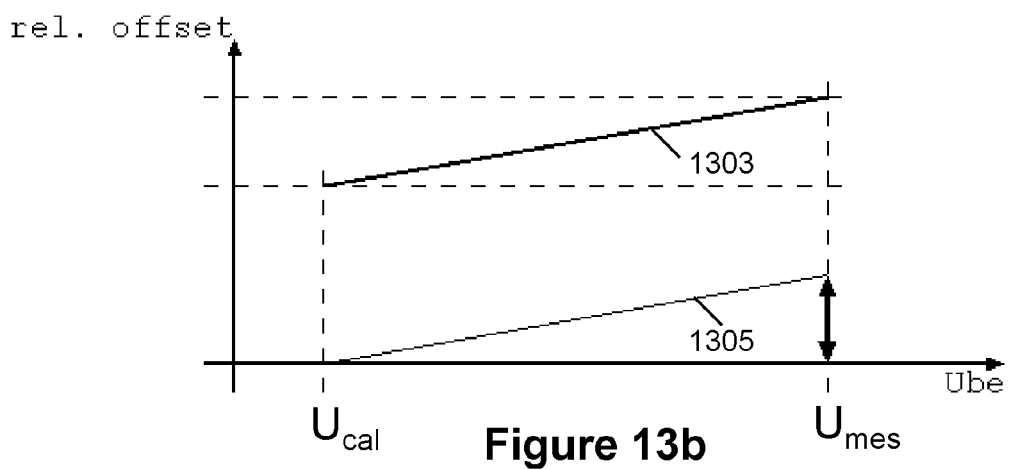
FIG. 13b shows a relative offset together with a residual relative offset after correction against base-emitter voltage on a linear scale.

In cases where the relative offset does vary slightly with respect to changes in the base-emitter potential, a residual offset may remain even after the uncorrected output current has been compensated for (at step 1209 of FIG. 12) using the relative offset determined in the calibration mode (at steps 1201, 1203). FIG. 13b illustrates (on a linear scale) the relative offset 1303 against the base-emitter voltage, $U_{BE}$, for a magneto-transistor where the relative offset is a weak function of the $U_{BE}$. That is, the change in relative offset with change in $U_{BE}$ is a factor less than the absolute relative offset. This factor may be 3, 4, 5, 10, 20 or greater than 100, for example. The residual relative offset is plotted as a curve 1305 in FIG. 13b. The residual relative offset 1305 at $U_{mes}$ is lower in value than the relative offset 1303 at $U_{mes}$ and so a calculated applied magnetic field value obtained by the method of FIG. 12 is an improved, that is, a more accurate value than the uncorrected output derived from the difference in the collector currents, $I_{c1}(U_{mes}) - I_{c2}(U_{mes})$, at the magneto-transistor.

However, some embodiments of the invention may account for change in the relative offset with base-emitter voltage by applying a further corrective function term at step 1209 of FIG. 12. Such embodiments may determine the corrected output, $I_{out}$, signal indicative of the applied magnetic field using the formula:

$$\Delta I_{out} = \Delta I_{uncorr} - f(U_{cal}, U_{mes}) * \Delta I_{rel\_off} * [I_{c1}(U_{mes}) + I_{c2}(U_{mes})].$$

The corrective function $f(U_{cal}, U_{mes})$ may be an empirical function or may be provided using calibration data that relates the relative offset to the base-emitter voltage over a specific voltage range, for example 0 to 3 V. However, embodiments of the invention may use a corrective function that takes the form of a corrected value that is determined with reference to $U_{cal}$ and $U_{mes}$.

Figure 13C:
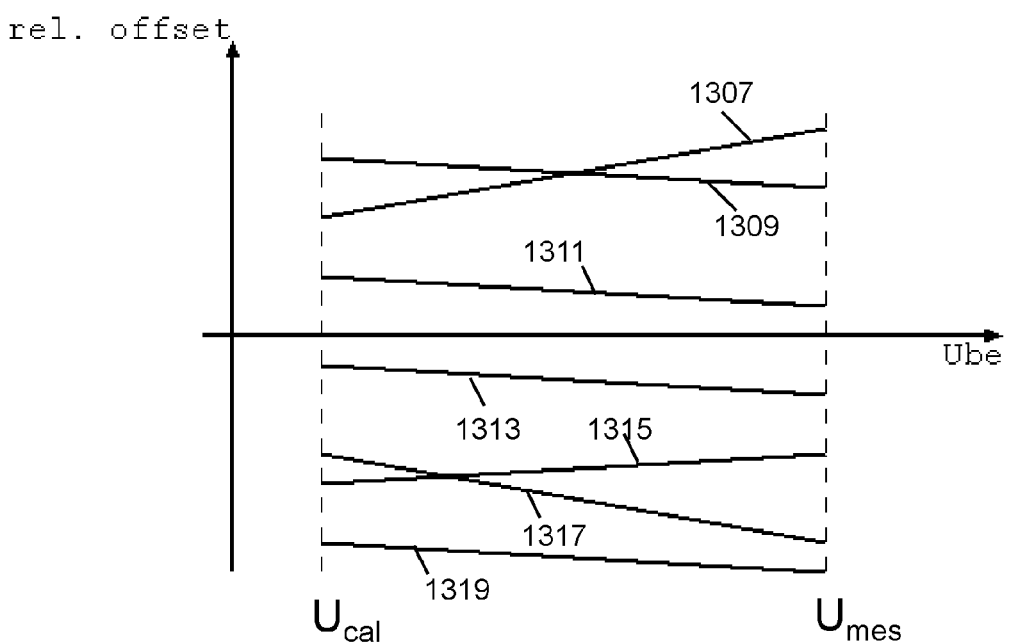
FIG. 13c shows the variation of the relative offset before correction against base-emitter voltage on a linear scale for seven different samples.

FIG. 13c shows the variation of the relative offset for seven different samples, represented by seven curves 1307-1319, against the base-emitter voltage. In this example, the spread between the samples is larger than the change of the relative offset with emitter-base voltage of a specific, single sample. Hence the residual offset achieved using the method of FIG. 12, even without the addition of the corrective function $f(U_{cal}, U_{mes})$, is small compared to the change in relative offset and so the output signal obtained using the method shown in FIG. 12 is more accurate than would be achieved using only the uncorrected output current difference.

Field-effect based transistors may also be constructed in which the output consists of two output terminals (e.g. collectors, such as drains) and in which the input terminal (e.g. emitters, such as sources) may be split in two equal parts, so as to obtain an offset-compensated magnetic-field sensitive FET, after applying the method of this invention. The invention is not limited either to devices that are sensitive to in-plane magnetic field axis or axes of sensitivity, but is also intended to encompass dual-output terminal devices with a magnetic field axis of sensitivity perpendicular to the active die surface.

Field-effect based transistors may also be constructed in which the output consists of two output terminals (e.g. collectors, such as drains) and in which the input terminal (e.g. emitters, such as sources) may be split in two equal parts, so as to obtain an offset-compensated magnetic-field sensitive FET, after applying the method of this invention. The invention is not limited either to devices that are sensitive to in-plane magnetic field axis or axes of sensitivity, but is also intended to encompass dual-output terminal devices with a magnetic field axis of sensitivity perpendicular to the active die surface.

Devices may also be constructed in the complementary conduction type: p-type instead of n-type and n-type instead of p-type conduction for all regions in the devices. The carrier type of interest to magnetic deflection then is changed from electrons into holes, which usually will result in lower sensitivities, as mobility of holes is lower than the one of electrons.

The terms 'first' and 'second' have been used to label instances of, for example, collectors and emitters. It will be appreciated that these labels may be swapped.

The described devices have in common that they possess an emitter (input terminal) and two collectors (output terminals) of which the differential collector current is the output signal of the sensor. As they have an in-plane magnetic field axis of sensitivity they may also be constructed as a four collector device, which is then sensitive to $B_x$ and $B_y$, or as a combination of two orthogonally positioned sensors which each have their own axis of sensitivity.

Other embodiments are also intended to be within the scope of the invention, as defined by the appended claims.

The invention claimed is:

1. A governing circuit for a magneto-transistor, the magneto-transistor comprising a first collector and a second collector, at least one emitter and at least one base, wherein the governing circuit is configured to:
    place the magneto-transistor in calibration mode with insensitivity to external magnetic fields by applying a calibration base-emitter voltage to the magneto-transistor;
    measure a first calibration current at the first collector of the magneto-transistor and a second calibration current at the second collector of the magneto-transistor, while the calibration base-emitter voltage is applied to the magneto-transistor;
    determine, based upon the first and second calibration currents, an offset value for the magneto-transistor;
    place the magneto-transistor in sense mode with sensitivity to external magnetic fields by applying a measurement base-emitter voltage to the magneto-transistor;
    measure a first measurement current at the first collector of the magneto-transistor and a second measurement current at the second collector of the magneto-transistor, while the measurement base-emitter voltage is applied to the magneto-transistor, wherein the measurement base-emitter voltage is different from the calibration base-emitter voltage; and
    determine an output signal indicative of an applied magnetic field using the measured first and second measurement currents and the offset value.

2. The governing circuit of claim 1, wherein the first and second calibration currents are substantially insensitive to an applied magnetic field.

3. The governing circuit of claim 1, wherein the measurement base-emitter voltage is higher than the calibration base-emitter voltage.

4. The governing circuit of claim 1, wherein the offset value represents a relative offset current from the first and second calibration currents; and wherein the governing circuit is configured to periodically enter the calibration mode and determine offset values for subsequent sense mode measurements.

5. The governing circuit of claim 4, further configured to determine the relative offset current at the calibration base-emitter voltage, $\Delta I_{rel\_off}(U_{cal})$, using the formula:

$$\Delta I_{rel\_off}(U_{cal}) = [I_{c1}(U_{cal}) - I_{c2}(U_{cal})] / [I_{c1}(U_{cal}) + I_{c2}(U_{cal})],$$

where $I_{c1}(U_{cal})$ is the first calibration current and $I_{c2}(U_{cal})$ is the second calibration current.

6. The governing circuit of claim 4, further configured to account for a change in the relative offset between the calibration base-emitter voltage and the measurement base-emitter voltage.

7. The governing circuit of claim 6, configured to multiply the relative offset current by a correction factor to account for a change in the relative offset between the calibration base-emitter voltage and the measurement base-emitter voltage, wherein the correction factor is empirically determined or determined by calibration.

8. The governing circuit claim 4, wherein the relative offset current is substantially insensitive to change in the base-emitter voltage between the calibration base-emitter voltage and the measurement base-emitter voltage.

9. The governing circuit of claim 1, wherein the output signal indicative of the applied magnetic field is a corrected output current, $\Delta I_{out}$, related to an uncorrected current, $\Delta I_{uncorr}$, equal to the difference between the first measurement current, $I_{c1}(U_{mes})$, and the second measurement current, $I_{c2}(U_{mes})$.

10. The governing circuit of claim 9, wherein the governing circuit is configured to calculate the corrected output current, $\Delta I_{out}$, using the formula:

$$\Delta I_{out} = \Delta I_{uncorr} - \Delta I_{rel\_off} * [I_{c1}(U_{mes}) + I_{c2}(U_{mes})].$$

11. The governing circuit of claim 1, wherein the magneto-transistor has a first and second emitter and wherein the governing circuit is further configured to apply the same base-emitter potential between the first emitter and the base and the second emitter and the base.

12. The governing circuit of claim 11, wherein the magneto-transistor has a first and second base and wherein the governing circuit is further configured to apply the same base-emitter potential between the first emitter and the first base and the second emitter and the second base.

13. A magnetic sensor assembly comprising the governing circuit of claim 1 and a semiconductor layer having the first collector, the second collector, a first emitter and a second emitter, wherein the governing circuit is configured to alternate between the calibration mode and the sense mode to determine additional offset values for subsequent sense mode measurements.

14. The magnetic sensor assembly of claim 13, wherein the first and second emitters are located between the first and second collectors.

15. The magnetic sensor assembly of claim 13, wherein the semiconductor layer further comprises a control region located between the collectors and the emitters, wherein the governing circuit is configured to govern current flow to and from the control region.

16. The magnetic sensor assembly of claim 15, wherein the control region is one or more of a guard control region and a base control region.

17. The magnetic sensor assembly of claim 13, wherein the first emitter and first collector form part of a first transistor, and the second emitter and second collector form part of a second transistor.

18. The magnetic sensor assembly of claim 13, wherein the governing circuit is configured to enable a first emitter current at the first emitter independently from a second emitter current at the second emitter.

19. The magnetic sensor assembly of claim 13, wherein the first and second emitters are spatially separated within the semiconductor layer.

20. The magnetic sensor assembly of claim 13, wherein the governing circuit comprises an offset differential amplifier configured to determine the difference between the first and second calibration current values.

21. The magnetic sensor assembly of claim 13, wherein the governing circuit is configured in a sensor mode to:
provide a current at the first emitter and the second emitter;
determine a first sensed current value corresponding to the current at the first collector and a second sensed current value corresponding to the current at the second collector; and
determine an output sensor value for the magnetic field using the first sensed current value, the second sensed current value and the offset value.

22. A method of operating a magneto-transistor comprising a first collector and a second collector, at least one emitter and at least one base, the method comprising:
applying a calibration base-emitter voltage to the magneto-transistor;
measuring a first calibration current at the first collector of the magneto-transistor and a second calibration current at the second collector of the magneto-transistor, while applying the calibration base-emitter voltage to the magneto-transistor;
determining, based upon the first and second calibration currents, an offset value for the magneto-transistor;
applying a measurement base-emitter voltage to the magneto-transistor;
measuring a first measurement current at the first collector of the magneto-transistor and a second measurement current at the second collector of the magneto-transistor, while applying the measurement base-emitter voltage to the magneto-transistor, wherein the measurement base-emitter voltage is different from the calibration base-emitter voltage; and
determining an output signal indicative of an applied magnetic field using the measured first and second measurement currents and the first and second calibration currents, wherein the output signal is a corrected output current that is determined as a function of an uncorrected current, a relative offset current, the first measurement current and the second measurement current.

23. A non-transitory, non-volatile, machine-readable medium containing one or more sequences of instructions for operating a magneto-transistor comprising a first collector and a second collector, at least one emitter and at least one base, the instructions configured to cause a processor to:
apply a calibration base-emitter voltage to the magneto-transistor;
measure a first calibration current at the first collector of the magneto-transistor and a second calibration current at the second collector of the magneto-transistor, while the calibration base-emitter voltage is applied to the magneto-transistor;
determine, based upon the first and second calibration currents, an offset value for the magneto-transistor;
apply a measurement base-emitter voltage to the magneto-transistor;
measure a first measurement current at the first collector of the magneto-transistor and a second measurement current at the second collector of the magneto-transistor, while the measurement base-emitter voltage is applied to the magneto-transistor, wherein the measurement base-emitter voltage is different from the calibration base-emitter voltage; and
determine an output signal indicative of an applied magnetic field using the measured first and second measurement currents and the first and second calibration currents.

24. A magnetic sensor assembly comprising:
a semiconductor layer having a first collector, a second collector, a first emitter and a second emitter;
an insulation layer situated between a substrate and the semiconductor layer; and
a governing circuit configured to control and measure current flow independently between the first collector and first emitter in a first direction, and between the second collector and second emitter in a second opposing direction,
wherein the governing circuit is configured in a calibration mode to:
measure a first calibration current at the first collector while:
applying a current between the first emitter and the first collector; and
preventing current flow at the second collector;
measure a second calibration current at the second collector while:
applying a current between the second emitter and the second collector; and
preventing current flow at the first collector; and
determine an offset current for use in a sensor mode based upon the difference between the first and second calibration currents.

25. The magnetic sensor assembly of claim 24, wherein the governing circuit comprises:
a first storage capacitor configured to store the first calibration current value; and
a second storage capacitor configured to store the second calibration current value.

26. A method of operating a magnetic sensor assembly, the magnetic sensor assembly comprising:
a semiconductor layer having a first collector, a second collector, a first emitter and a second emitter;
an insulation layer situated between a substrate and the semiconductor layer; and
a governing circuit configured to govern current flow between the collectors and emitters,
the method comprising implementing a calibration mode in which the governing circuit:
determines a first calibration current value at the first collector by measuring current at the first collector while:
applying a current between the first emitter and the first collector; and
restricting current from flowing at the second collector;
determine a second calibration current value at the second collector by measuring current at the second collector while:
applying a current between the second emitter and the second collector; and
restricting current from flowing at the first collector; and
determines the difference between the first and second calibration current values, thereby determining an offset value for use in a sensor mode.

27. The method of claim 26 comprising implementing a sensor mode in which the governing circuit:
provides a current at the first emitter and the second emitter;

determines a first sensed current value at the first collector and a second sensed current value at the second collector; and determines an output sensor value for the magnetic field using the first sensed current value, the second sensed current value and the offset value.

28. The method of claim 27, wherein the current provided to at least one of the first emitter and the second emitter in the sensor mode is adjusted according to the value of the offset determined in the calibration mode.

* * * * *